United States Patent
Lee et al.

(10) Patent No.: US 12,321,190 B2
(45) Date of Patent: Jun. 3, 2025

(54) MEMORY CONTROLLER FOR A MEMORY DEVICE

(71) Applicant: SAMSUNG ELECTRONICS CO., LTD., Suwon-si (KR)

(72) Inventors: Choongeui Lee, Suwon-si (KR); Hyungjin Kim, Suwon-si (KR); Jonghyun Jang, Suwon-si (KR); Chulseung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 17/846,289

(22) Filed: Jun. 22, 2022

(65) Prior Publication Data
US 2023/0168707 A1 Jun. 1, 2023

(30) Foreign Application Priority Data
Nov. 30, 2021 (KR) .................. 10-2021-0168227

(51) Int. Cl.
| | | |
|---|---|---|
| *G06F 1/08* | (2006.01) | |
| *G06F 1/10* | (2006.01) | |
| *G06F 13/00* | (2006.01) | |
| *G06F 13/16* | (2006.01) | |
| *G06F 13/42* | (2006.01) | |
| *G11C 7/10* | (2006.01) | |
| *G11C 29/02* | (2006.01) | |

(52) U.S. Cl.
CPC .................. *G06F 1/08* (2013.01); *G06F 1/10* (2013.01); *G06F 13/00* (2013.01); *G06F 13/1689* (2013.01); *G06F 13/4243* (2013.01); *G11C 7/1066* (2013.01); *G11C 29/022* (2013.01)

(58) Field of Classification Search
CPC .. G06F 13/1689; G06F 13/00; G06F 13/4243; G06F 1/08; G06F 1/10; G11C 7/1066; G11C 29/022
USPC .................. 713/400, 401, 500, 503; 710/61
See application file for complete search history.

(56) References Cited

U.S. PATENT DOCUMENTS

| | | |
|---|---|---|
| 6,167,528 A | 12/2000 | Arcoleo |
| 6,219,288 B1 | 4/2001 | Braceras et al. |
| 6,639,956 B1 | 10/2003 | Song |
| 6,795,354 B2 | 9/2004 | Cho et al. |
| 7,298,188 B2 | 11/2007 | Kawaski |

(Continued)

FOREIGN PATENT DOCUMENTS

JP 2002-0204222 7/2002

OTHER PUBLICATIONS

European search report dated Mar. 17, 2023 from the European Patent Office for European Patent Application No. 22199706.7.

*Primary Examiner* — Ji H Bae
(74) *Attorney, Agent, or Firm* — MORGAN, LEWIS & BOCKIUS LLP

(57) ABSTRACT

A memory controller for a memory device, the memory controller including: a command generator configured to generate a command signal based on a system clock signal, and to generate phase difference information for the command signal; and a memory interface configured to receive the command signal and the phase difference information from the command generator, to adjust a timing of the command signal based on the phase difference information, and transmit the command signal of which the timing is adjusted as a timing adjusted command signal to the memory device.

16 Claims, 19 Drawing Sheets

(56) References Cited

U.S. PATENT DOCUMENTS

| | | | |
|---|---|---|---|
| 7,679,133 B2 | 3/2010 | Son et al. | |
| 8,103,917 B2 | 1/2012 | Jang | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,047,929 B2 | 6/2015 | Seo et al. | |
| 10,872,647 B2 | 12/2020 | Qawami et al. | |
| 2010/0257397 A1 | 10/2010 | Schoenborn et al. | |
| 2010/0271092 A1* | 10/2010 | Zerbe | G11C 7/1093 327/161 |
| 2011/0205818 A1* | 8/2011 | Moon | G11C 7/22 365/233.5 |
| 2011/0233648 A1 | 9/2011 | Seol et al. | |
| 2014/0293710 A1* | 10/2014 | Ware | G11C 29/022 365/194 |
| 2017/0110169 A1* | 4/2017 | Kim | G06F 13/1689 |
| 2020/0004289 A1 | 1/2020 | Giaccio et al. | |
| 2020/0126609 A1* | 4/2020 | Kim | G06F 3/0604 |
| 2023/0025173 A1* | 1/2023 | Lee | G11C 29/028 |

\* cited by examiner

FIG. 4

| SYS_CLK = 500 Mhz | | CONVENTIONAL | EMBODIMENT |
|---|---|---|---|
| tWC | | 12 ns | 10 ns |
| Read Efficiency | | 51.38 % | 52.54 % |
| RANDOM READ | UNIT | 128 KB | |
| | TIME | 127.6 μs | 124.7 μs |
| | KIOPs | 3904.9 KIOPs | 3993.0 KIOPs |

MEMORY CONTROLLER FOR A MEMORY DEVICE

CROSS-REFERENCE TO RELATED APPLICATION

This application claims priority under 35 U.S.C. § 119 to Korean Patent Application No. 10-2021-0168227, filed on Nov. 30, 2021 in the Korean Intellectual Property Office (KIPO), the disclosure of which is incorporated by reference herein in its entirety.

1. TECHNICAL FIELD

Example embodiments of the present disclosure relate to semiconductor integrated circuits, and more particularly to a memory controller for a memory device.

2. DESCRIPTION OF THE RELATED ART

Semiconductor memory devices can be volatile memory devices, which lose stored data when disconnected from power, and nonvolatile memory devices, which retain stored data when disconnected from power. Volatile memory devices may perform read and write operations at a high speed; however, contents stored therein may be lost at power-off. Nonvolatile memory devices may retain contents stored therein even at power-off. As a consequence, nonvolatile memory devices may be used to store data that must be retained regardless of whether they are powered or not.

A semiconductor memory device may be controlled by a memory controller. The memory controller may communicate with the semiconductor memory device through an interface. The memory controller may transmit a command signal to the semiconductor memory device through the interface, and the semiconductor memory device may perform a corresponding operation in response to the command signal.

SUMMARY

At least one example embodiment of the present disclosure provides a memory controller that is capable of removing or reducing a timing overhead of a command signal transmitted to a memory device.

According to example embodiments of the present disclosure, there is provided a memory controller for a memory device, the memory controller including: a command generator configured to generate a command signal based on a system clock signal, and to generate phase difference information for the command signal; and a memory interface configured to receive the command signal and the phase difference information from the command generator, to adjust a timing of the command signal based on the phase difference information, and transmit the command signal of which the timing is adjusted as a timing adjusted command signal to the memory device.

According to example embodiments of the present disclosure, there is provided a memory controller for a memory device, the memory controller including: a command pin; and a memory interface configured to output a command signal at the command pin, wherein a timing of the command signal when the memory controller operates in response to a system clock signal having a first frequency is substantially the same as a timing of the command signal when the memory controller operates in response to the system clock signal having a second frequency different from the first frequency.

According to example embodiments of the present disclosure, there is provided a memory controller for a memory device, the memory controller including: a clock generator configured to generate a system clock signal; a command generator configured to generate a command signal in response to the system clock signal; and a memory interface configured to transmit a timing adjusted command signal to the memory device, wherein the command generator includes: a phase generation circuit configured to generate phase difference information representing a phase difference between the command signal and a standard command signal, and wherein the memory interface includes: a delay locked loop circuit configured to generate a clock lock value corresponding to a cycle time of the system clock signal; a phase control circuit configured to generate a delay control value based on the phase difference represented by the phase difference information, a resolution value of the phase difference and the clock lock value; and a phase application circuit configured to adjust a timing of the command signal by the phase difference represented by the phase difference information based on the delay control value and to output the command signal with the adjusted timing as the timing adjusted command signal.

In a memory controller for a memory device according to example embodiments of the present disclosure, a memory interface that transmits a command signal to the memory device may adjust a timing of the command signal based on phase difference information according to a timing defined in a controller-memory interface standard. Accordingly, a timing overhead of the command signal may be removed or reduced, and a throughput of the memory device and a memory system may be improved.

BRIEF DESCRIPTION OF THE DRAWINGS

Illustrative, non-limiting example embodiments of the present disclosure will be more clearly understood from the following detailed description taken in conjunction with the accompanying drawings.

FIG. 4 is a diagram for describing an example of a throughput of a memory device operating in response to a conventional command signal and a throughput of a memory device operating in response to a command signal according to example embodiments of the present disclosure.

DETAILED DESCRIPTION OF THE EMBODIMENTS

Figure 1:
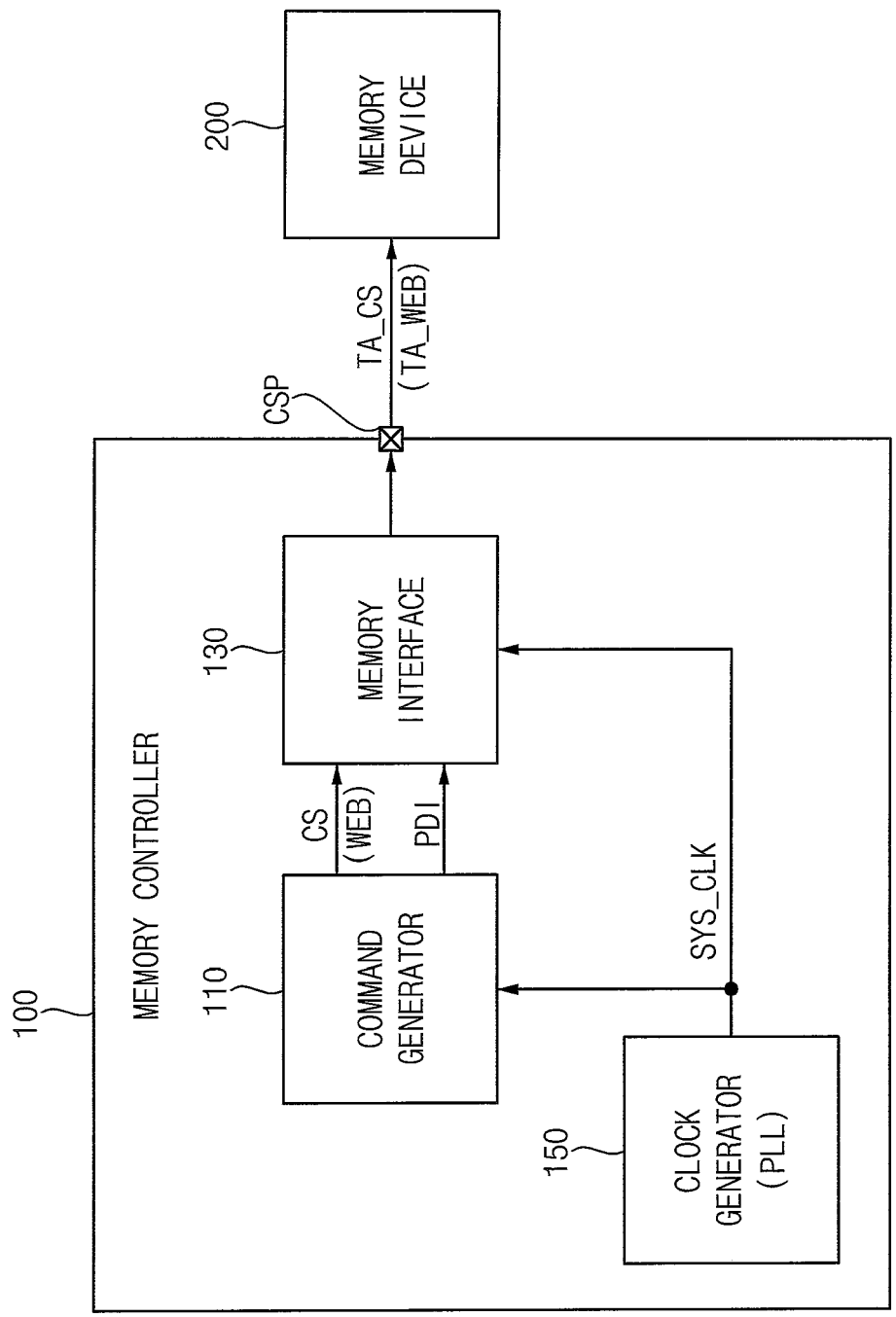
FIG. 1 is a block diagram illustrating a memory controller for a memory device according to example embodiments of the present disclosure.

Various example embodiments of the present disclosure will be described more fully with reference to the accompanying drawings. The present disclosure may, however, be embodied in many different forms and should not be construed as limited to the embodiments set forth herein. Like reference numerals refer to like elements throughout this application.

FIG. 1 is a block diagram illustrating a memory controller for a memory device according to example embodiments of the present disclosure.

Figure 15:
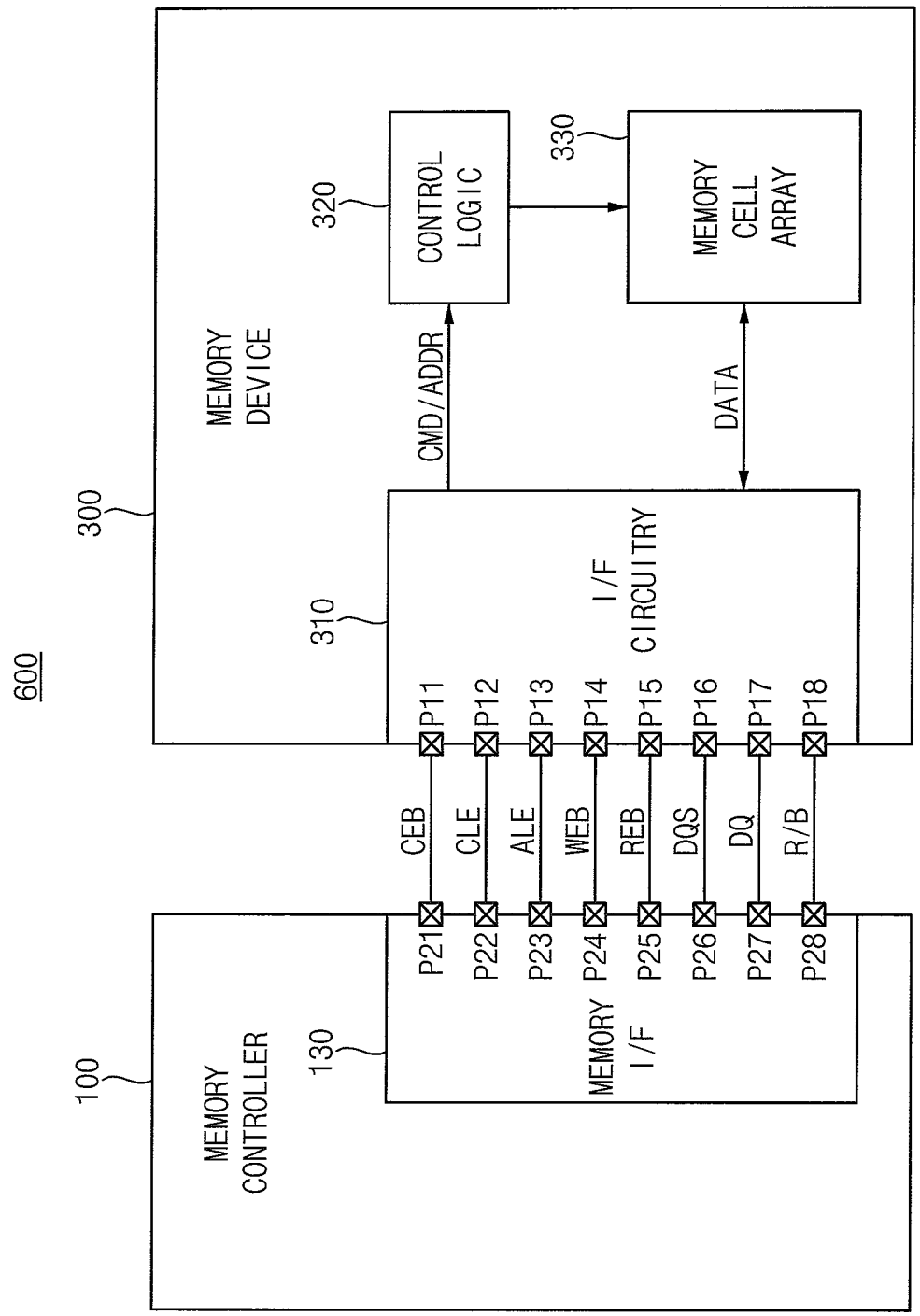
FIG. 15 is a block diagram for describing signals transferred between a memory controller and a memory device in a memory system according to example embodiments of the present disclosure.
Figure 16:
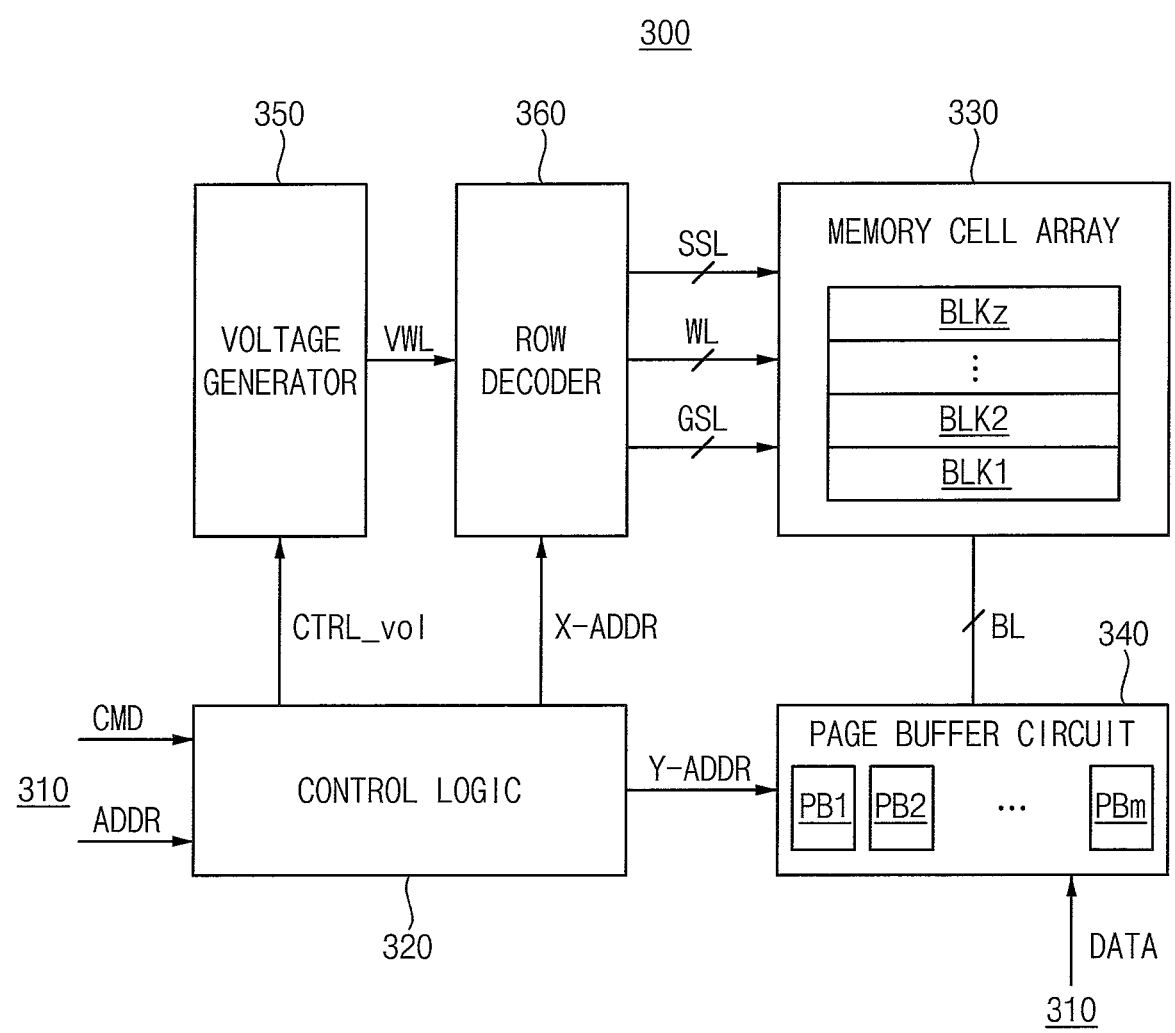
FIG. 16 is a block diagram illustrating an example of a memory device included in a memory system according to example embodiments of the present disclosure.

Referring to FIG. 1, a memory controller 100 according to example embodiments of the present disclosure may control a memory device 200. The memory controller 100 and the memory device 200 may be included in a memory system as illustrated in FIG. 15 or FIG. 16. For example, the memory system may be, but is not limited to, a solid state drive (SSD), a universal flash storage (UFS), a multi media card (MMC), an embedded MMC (eMMC), a secure digital (SD) card, a micro SD card, a memory stick, a chip card, a universal serial bus (USB) card, a smart card, a compact flash (CF) card, etc.

The memory controller 100 may include a command generator 110 and a memory interface 130. In some example embodiments of the present disclosure, the memory controller 100 may further include a clock generator 150 that generates a system clock signal SYS_CLK. The clock generator 150 may provide the system clock signal SYS_CLK to the command generator 110 and the memory interface 130. In some example embodiments of the present disclosure, the clock generator 150 may further generate an input/output clock signal and provide the input/output clock signal to the memory interface 130. Further, in some example embodiments of the present disclosure, the clock generator 150 may be implemented with, but is not limited to, a phase locked loop (PLL) circuit.

The command generator 110 may generate a command signal CS based on the system clock signal SYS_CLK. A level of the command signal CS generated based on the system clock signal SYS_CLK may be changed at an edge (e.g., a rising edge) of the system clock signal SYS_CLK. In some example embodiments of the present disclosure, the memory controller 100 may receive a host command from a host, and the command generator 110 may generate the command signal CS representing a command for the memory device 200 in response to the host command. Here, the command signal CS may be any signal for transferring the command (and/or an address) for the memory device 200. For example, the command signal CS may be, but is not limited to, a write enable signal WEB as illustrated in FIG. 1. In other examples, the command signal CS may further include an address latch enable signal, a command latch enable signal, or the like. In still other examples, the command signal CS may further include a data signal during a period in which the command and/or the address are transferred.

The command generator 110 may generate phase difference information PDI for the command signal CS when generating the command signal CS (e.g., when changing the level of the command signal CS). The phase difference information PDI for the command signal CS may represent a phase difference between the command signal CS generated based on the system clock signal SYS_CLK and a standard command signal having a standard timing defined in a controller-memory interface standard between the memory controller 100 and the memory device 200. In some example embodiments of the present disclosure, in the controller-memory interface standard, an alternating current (AC) timing (e.g., a minimum low period width, a minimum high period width, a minimum cycle time, a hold time, a setup time, etc.) of the command signal CS may be defined, and the phase difference information PDI may represent a phase difference (or a time difference) between a timing of the command signal CS generated based on the system clock signal SYS_CLK and the defined AC timing.

The memory interface 130 may receive the command signal CS and the phase difference information PDI from the command generator 110, and may generate a timing adjusted command signal TA_CS (e.g., a timing adjusted write enable signal TA_WEB) by adjusting the timing of the command signal CS based on the phase difference information PDI. For example, the memory interface 130 may adjust a low period width of the command signal CS such that a low period width of the timing adjusted command signal TA_CS corresponds to the minimum low period width defined in the controller-memory interface standard. In addition, the memory interface 130 may adjust a high period width of the command signal CS such that a high period width of the timing adjusted command signal TA_CS corresponds to the minimum high period width defined in the controller-memory interface standard. Furthermore, the memory interface 130 may adjust a cycle time of the command signal CS such that a cycle time of the timing adjusted command signal TA_CS corresponds to the minimum cycle time defined in the controller-memory interface standard. In some example embodiments of the present disclosure, to adjust the timing of the command signal CS, the memory interface 130 may delay the command signal CS by a delay time corresponding to the phase difference represented by the phase difference information PDI.

The memory controller 100 may further include a command pin CSP. For example, in a case where the command signal CS is the write enable signal WEB, the address latch enable signal, and/or the command latch enable signal, the command pin CSP may be an output pin. In another example, in a case where the command signal CS is the data signal for transferring the command and/or the address, the command pin CSP may be an input/output pin. The memory interface 130 may output the timing adjusted command signal TA_CS at the command pin CSP. The timing adjusted command signal TA_CS output at the command pin CSP may be provided to the memory device 200, and the memory device 200 may perform an operation (e.g., a read operation, a program (or write) operation, an erasure operation, etc.) in response to the timing adjusted command signal TA_CS.

Since the level of the command signal CS generated based on the system clock signal SYS_CLK is changed in a unit of a cycle time (or a period) of the system clock signal SYS_CLK, the command signal CS may have, at a maximum, a timing overhead corresponding to the cycle time of the system clock signal SYS_CLK compared with the standard timing defined in the controller-memory interface standard. However, in the memory controller 100 according to example embodiments of the present disclosure, the memory interface 130 may adjust the timing of the command signal CS based on the phase difference information PDI according to the standard timing defined in the controller-memory interface standard. Accordingly, the timing overhead of the command signal CS may be removed or reduced, and a throughput of the memory device 200 and the memory system may be improved.

Figure 2:
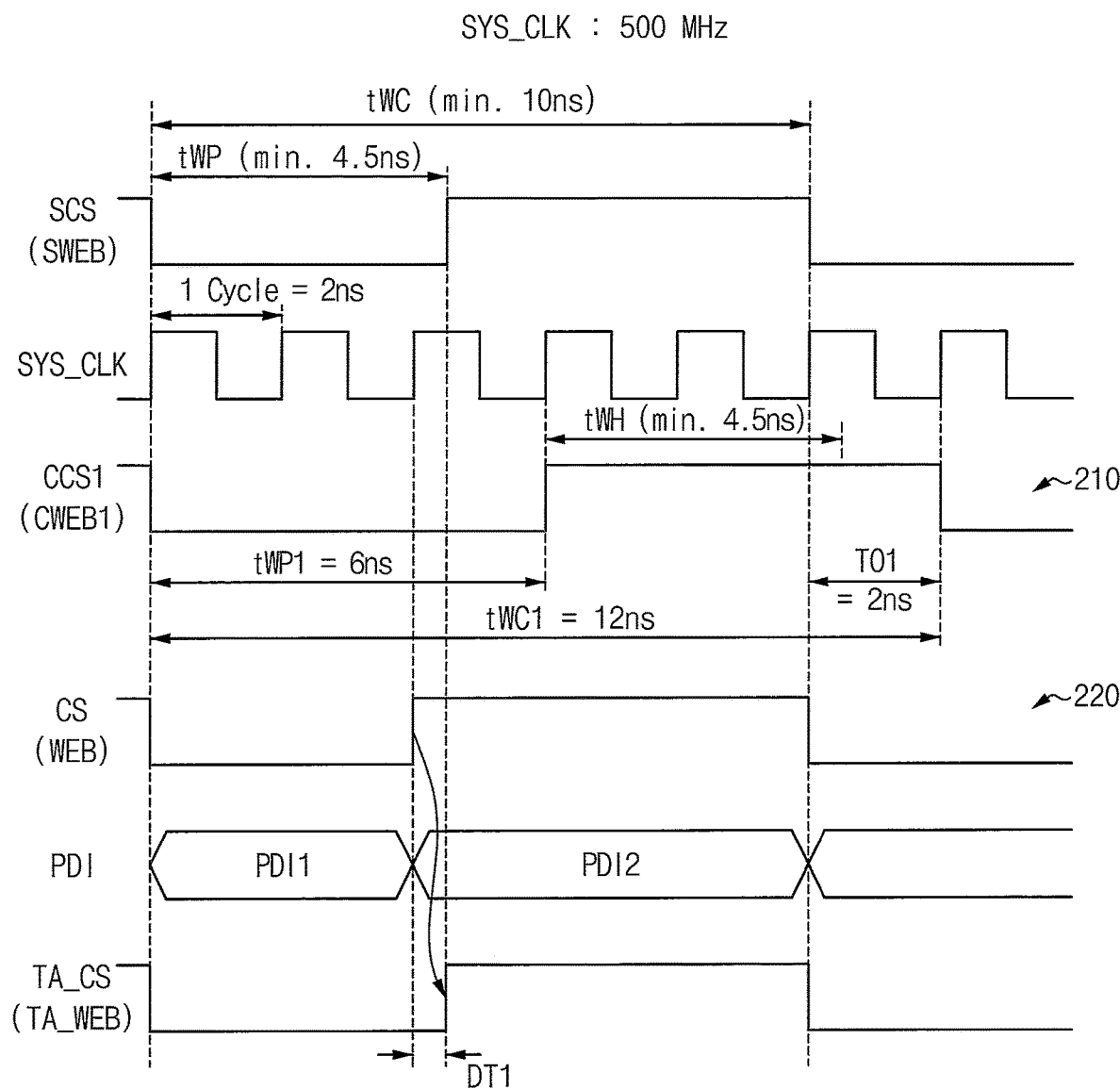
FIG. 2 is a timing diagram for describing an example where a timing of a command signal is adjusted in a system clock signal of about 500 MHz.
Figure 3:
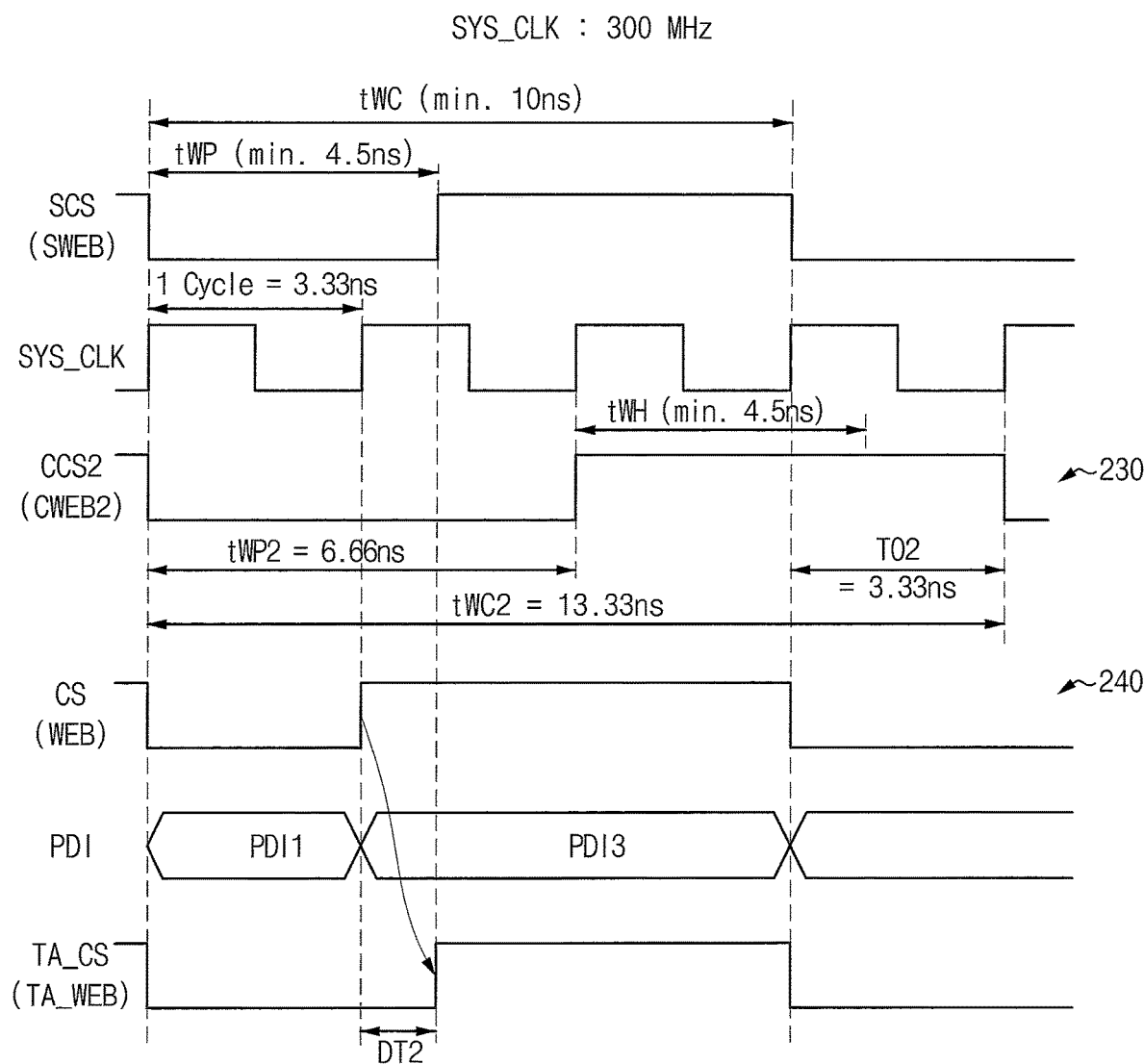
FIG. 3 is a timing diagram for describing an example where a timing of a command signal is adjusted in a system clock signal of about 300 MHz.

FIG. 2 is a timing diagram for describing an example where a timing of a command signal is adjusted in a system clock signal of about 500 MHz, and FIG. 3 is a timing diagram for describing an example where a timing of a command signal is adjusted in a system clock signal of about 300 MHz.

FIGS. 2 and 3 illustrate examples where, in a controller-memory interface standard, a low period width tWP (e.g., a write enable signal pulse width) of a command signal CS (e.g., a write enable signal WEB) is about 4.5 ns, a high period width tWH of the command signal CS is about 4.5 ns, and a cycle time IWC of the command signal CS is about 10 ns.

In an example of FIG. 2, a memory controller 100 operates based on a system clock signal SYS_CLK of about 500 MHz. Thus, in the example of FIG. 2, a cycle time (or a period) of the system clock signal SYS_CLK may be about 2 ns. Further, in FIG. 2, a first timing diagram 210 for a conventional memory controller and a second timing diagram 220 for the memory controller 100 according to example embodiments of the present disclosure are illustrated.

As illustrated in the first timing diagram 210 of FIG. 2, a conventional command signal CCS1 (e.g., a conventional write enable signal CWEB1) output from the conventional memory controller may have a low period width tWP1 of about 6 ns corresponding to three cycles of the system clock signal SYS_CLK to satisfy the low period width tWP of about 4.5 ns defined in the controller-memory interface standard. Further, the conventional command signal CCS1 may have a cycle time tWC1 of about 12 ns to satisfy the high period width tWH of about 4.5 ns defined in the controller-memory interface standard. Accordingly, compared with a standard command signal SCS (e.g., a standard write enable signal SWEB) having a standard timing (e.g., the low period width tWP, the high period width (WH, the cycle time (WC, etc.) defined in the controller-memory interface standard, the conventional command signal CCS1 output from the conventional memory controller may have a timing overhead TO1 of about 2 ns in each cycle of the conventional command signal CCS1.

However, in the memory controller 100 according to example embodiments of the present disclosure, as illustrated in the second timing diagram 220 of FIG. 2, a timing adjusted command signal TA_CS (e.g., a timing adjusted write enable signal TA_WEB) corresponding to the standard command signal SCS may be output. Referring to FIGS. 1 and 2, when the command signal CS having a low level is output, a command generator 110 of the memory controller 100 may generate first phase difference information PDI1 representing a phase difference of about 0 degree, and a memory interface 130 of the memory controller 100 may output the command signal CS as is based on the first phase difference information PDI1. After two cycles of the system clock signal SYS_CLK, or after about 4 ns, the command generator 110 may change a level of the command signal CS to a high level, and may generate second phase difference information PDI2 representing a phase difference (e.g., a phase difference of about 90 degrees) between the command signal CS and the standard command signal SCS. The memory interface 130 may generate the timing adjusted command signal TA_CS by delaying the command signal CS by a delay time DT1 (e.g., about 0.5 ns) corresponding to the phase difference between the command signal CS and the standard command signal SCS based on the second phase difference information PDI2. Accordingly, the command signal TA_CS output from the memory controller 100 according to example embodiments of the present disclosure may have a timing substantially the same as the standard timing of the standard command signal SCS, and may have no timing overhead TO1.

In an example of FIG. 3, the memory controller 100 operates based on the system clock signal SYS_CLK of about 300 MHz. Thus, in the example of FIG. 3, the cycle time (or the period) of the system clock signal SYS_CLK may be about 3.33 ns. Further, in FIG. 3, a third timing diagram 230 for the conventional memory controller and a fourth timing diagram 240 for the memory controller 100 according to example embodiments of the present disclosure are illustrated.

As illustrated in the third timing diagram 230 of FIG. 3, a conventional command signal CCS2 (e.g., a conventional write enable signal CWEB2) output from the conventional memory controller may have a low period width tWP2 of about 6.66 ns corresponding to two cycles of the system clock signal SYS_CLK to satisfy the low period width tWP of about 4.5 ns defined in the controller-memory interface standard. Further, the conventional command signal CCS2 may have a cycle time (WC2 of about 13.33 ns to satisfy the high period width (WH of about 4.5 ns defined in the controller-memory interface standard. Accordingly, compared with the standard command signal SCS having the standard timing defined in the controller-memory interface standard, the conventional command signal CCS2 output from the conventional memory controller may have a timing overhead TO2 of about 3.33 ns in each cycle of the conventional command signal CCS2.

Referring to FIGS. 1 and 3, as illustrated in the fourth timing diagram 240 of FIG. 2, when the level of the command signal CS is changed to the high level, the command generator 110 may generate third phase difference information PDI3 representing a phase difference (e.g., a phase difference of about 126 degrees) between the command signal CS and the standard command signal SCS. The memory interface 130 may generate the timing adjusted command signal TA_CS by delaying the command signal CS by a delay time DT2 (e.g., about 1.167 ns) corresponding to the phase difference between the command signal CS and the standard command signal SCS based on the third phase difference information PDI3. Accordingly, the command signal TA_CS output from the memory controller 100 according to example embodiments of the present disclosure may have a timing substantially the same as the standard timing of the standard command signal SCS, and may have no timing overhead TO2.

As illustrated in the first timing diagram 210 of FIG. 2 and the third timing diagram 230 of FIG. 3, the conventional command signals CCS1 and CCS2 may have the timing overheads TO1 and TO2, and the timings of the conventional command signals CCS1 and CCS2 based on the system clock signals SYS_CLK having different frequencies may be different from each other. However, in the memory controller 100 according to example embodiments of the present disclosure, when the memory controller 100 operates based on the system clock signal SYS_CLK having a first frequency of about 500 MHz, the command generator 110 may generate the second phase difference information PDI2 representing the phase difference between the command signal CS synchronized with the system clock signal SYS_CLK having the first frequency and the standard command signal SCS, and the memory interface 130 may output the command signal TA_CS having the timing substantially the same as the standard timing of the standard command signal SCS by delaying the command signal CS based on the second phase difference information PDI2. Further, when the memory controller 100 operates based on the system clock signal SYS_CLK having a second frequency of about 300 MHz, the command generator 110 may generate the third phase difference information PDI3 representing the phase difference between the command signal CS synchronized with the system clock signal SYS_CLK having the second frequency and the standard command signal SCS, and the memory interface 130 may output the command signal TA_CS having the timing substantially the same as the standard timing of the standard command signal SCS by delaying the command signal CS based on the third phase difference information PDI3. Thus, as illustrated in the second timing diagram 220 of FIG. 2 and the fourth timing diagram 240 of FIG. 3, the timing (e.g., a cycle time, a low period width and/or a high period width) of the command signal TA_CS output when the memory controller 100 operates based on the system clock signal SYS_CLK having the first frequency and the timing (e.g., a cycle time, a low period width and/or a high period width) of the command signal TA_CS output when the memory controller 100 operates based on the system clock signal SYS_CLK having the second frequency may be substantially the same as each other, and may be substantially the same as the standard timing of the standard command signal SCS. Accordingly, the command signal TA_CS output from the memory controller 100 according to example embodiments of the present disclosure may have no or almost no timing overhead TO1 and TO2.

FIG. 4 is a diagram for describing an example of a throughput of a memory device operating in response to a conventional command signal and a throughput of a memory device operating in response to a command signal according to example embodiments of the present disclosure.

Referring to FIGS. 1, 2 and 4, in a case where a conventional memory controller and a memory controller 100 according to example embodiment of the present disclosure operate based on a system clock signal SYS_CLK of about 500 MHz, a conventional command signal CCS1 output from the conventional memory controller may have a timing overhead TO1 of about 2 ns, and may have a cycle time of about 12 ns. However, a command signal TA_CS output from the memory controller 100 may have no timing overhead TO1, and may have a cycle time of about 10 ns. For example, the cycle time of the command signal TA_CS output from the memory controller 100 may be 2 nS less than the cycle time of the conventional command signal CCS1 output from the conventional memory controller. Accordingly, in a memory system including the memory controller 100 according to example embodiments of the present disclosure, a time during which a command and/or an address are transferred may be reduced. For example, in a case where a read operation is performed by the conventional memory controller, a read efficiency that is a ratio of a data transfer time to a total time may be about 51.38%, However, a read efficiency of a read operation performed by the memory controller 100 may be improved to about 52.54%. Further, in a case where a random read operation is performed in a data unit of about 128 KB, a time of one random read operation by the conventional memory controller may be about 127.6 μs, but a time of one random read operation by the memory controller 100 may be about 124.7 μs. Accordingly, a throughput of a conventional memory system including the conventional memory controller may be about 3904.9 kilo input/output operations per second (KIOPs), but a throughput of a memory system including the memory controller 100 may be improved to about 3993.0 KIOPs.

Figure 5:
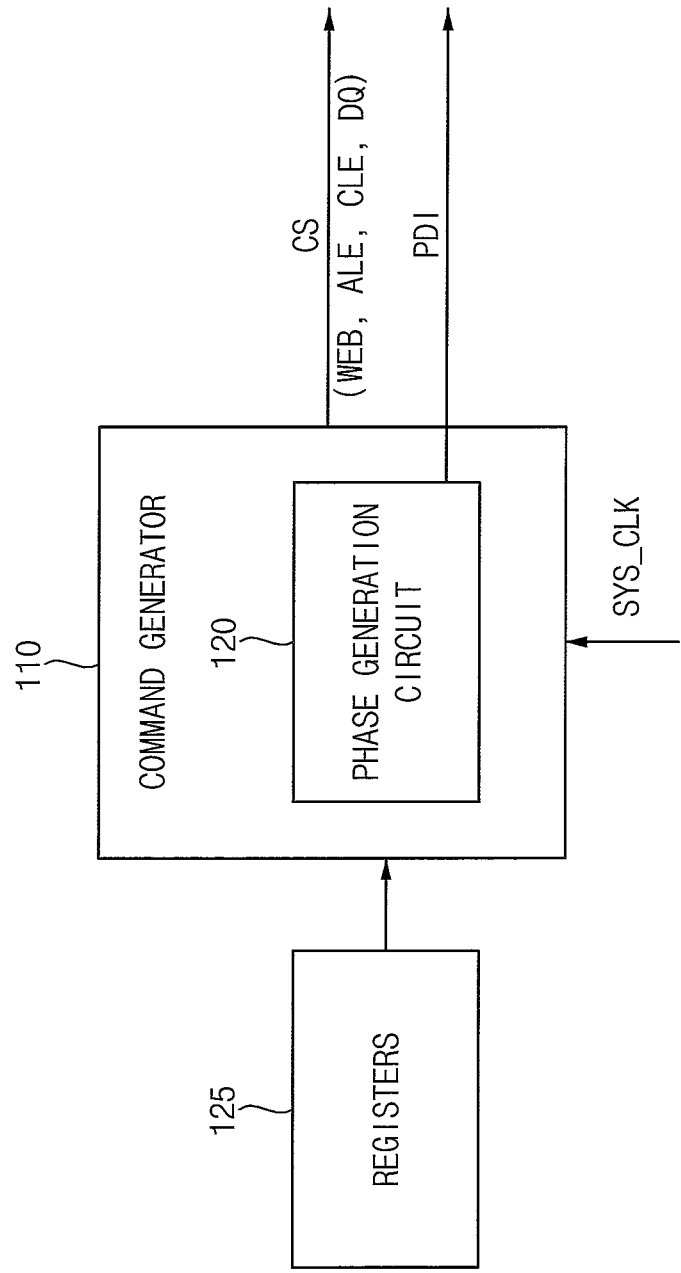
FIG. 5 is a block diagram illustrating a command generator included in a memory controller according to example embodiments of the present disclosure.
Figure 6:
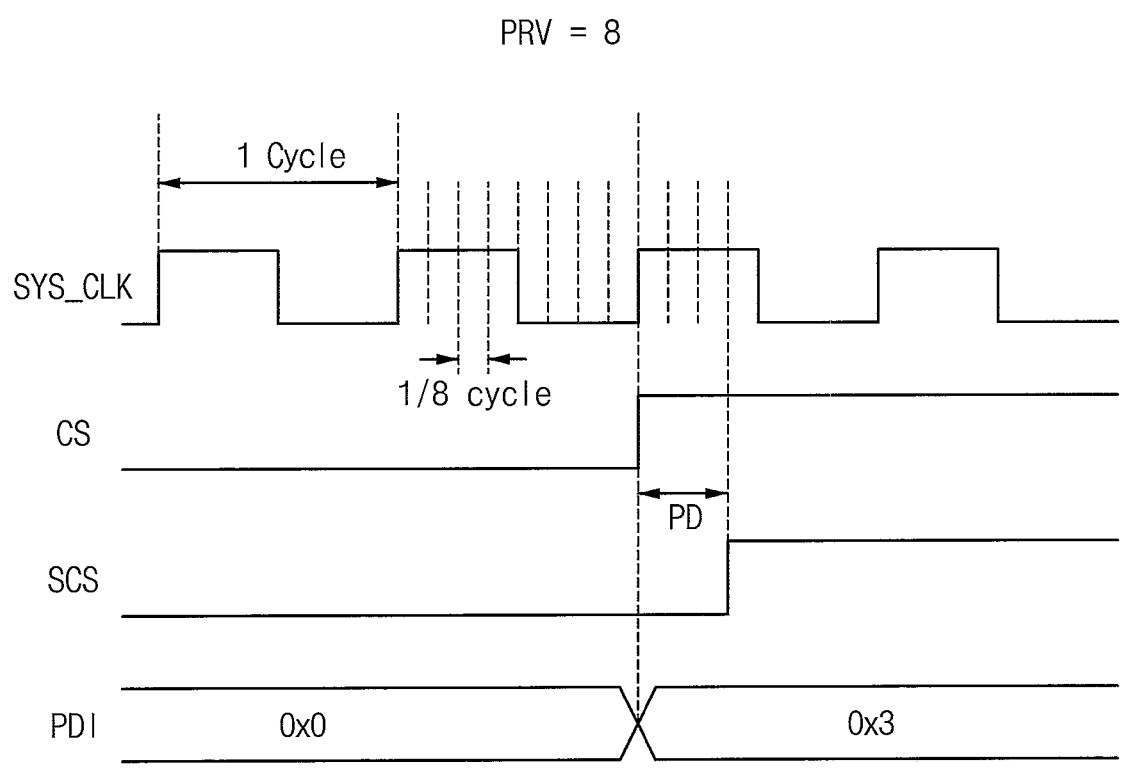
FIG. 6 is a timing diagram for describing an example of phase difference information.

FIG. 5 is a block diagram illustrating a command generator included in a memory controller according to example embodiments of the present disclosure, and FIG. 6 is a timing diagram for describing an example of phase difference information.

Referring to FIG. 5, a command generator 110 of the memory controller may generate a command signal CS based on a system clock signal SYS_CLK. The command signal CS may include, but is not limited to, a write enable signal WEB, an address latch enable signal ALE, a command latch enable signal CLE and a data signal DQ for transferring a command (and/or an address). In some example embodiments of the present disclosure, the command generator 110 may receive information about a standard timing defined in a controller-memory interface standard for the command signal CS from registers 125 (e.g., special function registers (SFR)), and may generate the command signal CS satisfying the standard timing defined in the controller-memory interface standard. However, the command signal CS generated by the command generator 110 may have a timing overhead. The command generator 110 may include a phase generation circuit 120 that generates phase difference information PDI for the command signal CS. The phase difference information PDI may be used to reduce or eliminate the timing overhead of the command signal CS.

The phase generation circuit 120 may generate the phase difference information PDI representing a phase difference between the command signal CS and a standard command signal having the standard timing defined in the controller-memory interface standard. In some example embodiments of the present disclosure, the phase difference between the command signal CS and the standard command signal may be previously determined, and the phase difference information PDI representing the phase difference may be loaded into the registers 125 when the memory controller 100 including the command generator 110 is initialized. When the command signal CS is generated, the phase generation circuit 120 may read the phase difference information PDI suitable for the command signal CS from the registers 125, and may provide the phase difference information PDI to a memory interface 130.

In some example embodiments of the present disclosure, a unit or an interval of the phase difference represented by the phase difference information PDI may be determined by equally dividing one cycle of the system clock signal SYS_CLK by a resolution value. For example, as illustrated in FIG. 6, in a case where the resolution value PRV of the phase difference is eight, the phase difference represented by the phase difference information PDI may have a unit or an interval corresponding to one eighth of one cycle of the system clock signal SYS_CLK. Further, in the example of FIG. 6, in a case where the command signal CS and the standard command signal SCS have a phase difference of about 0 degree, the phase difference information PDI may have a value of '0' representing the phase difference of about 0 degree. Further, in a case where the command signal CS and the standard command signal SCS have a phase difference of about 135 degrees, or in a case where the command signal CS and the standard command signal SCS have a time difference corresponding to three eighths of one cycle of the system clock signal SYS_CLK, the phase difference information PDI may have a value of '3' representing the phase difference of about 135 degrees, or the time difference corresponding to three eighths of one cycle of the system clock signal SYS_CLK. In the case, for example, where the command signal CS and the standard command signal SCS have a time difference corresponding to five eighths of one cycle of the system clock signal SYS_CLK, the phase difference information PDI may have a value of '5' representing the time difference corresponding to five eighths of one cycle of the system clock signal SYS_CLK. Although FIG. 6 illustrates the example where the resolution value PRV of the phase difference is eight, the resolution value PRV of the phase difference is not limited to the example of FIG. 6. In some example embodiments of the present disclosure, the resolution value PRV of the phase difference may be settable. For example, the resolution value PRV may be stored in the registers 125, and a setting of the resolution value PRV may be updated by changing the resolution value PRV stored in the registers 125.

Figure 7:
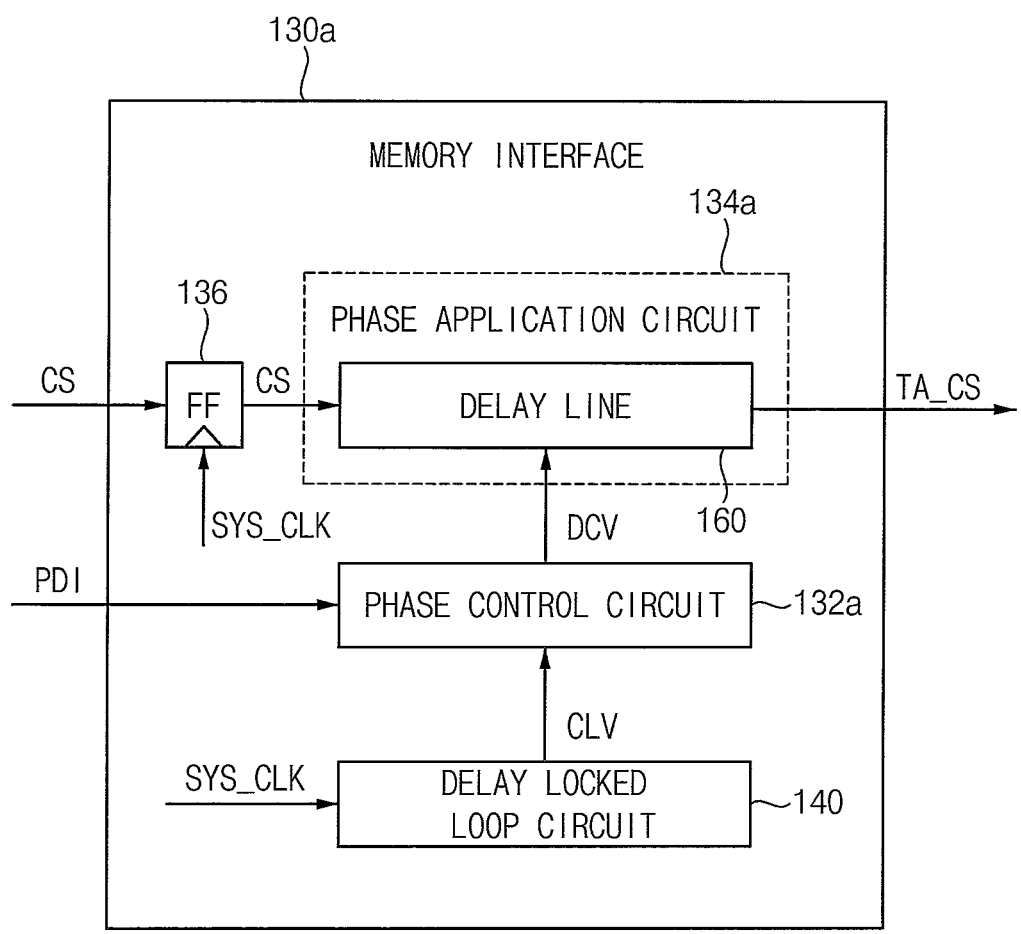
FIG. 7 is a block diagram illustrating a memory interface included in a memory controller according to example embodiments of the present disclosure.
Figure 8:
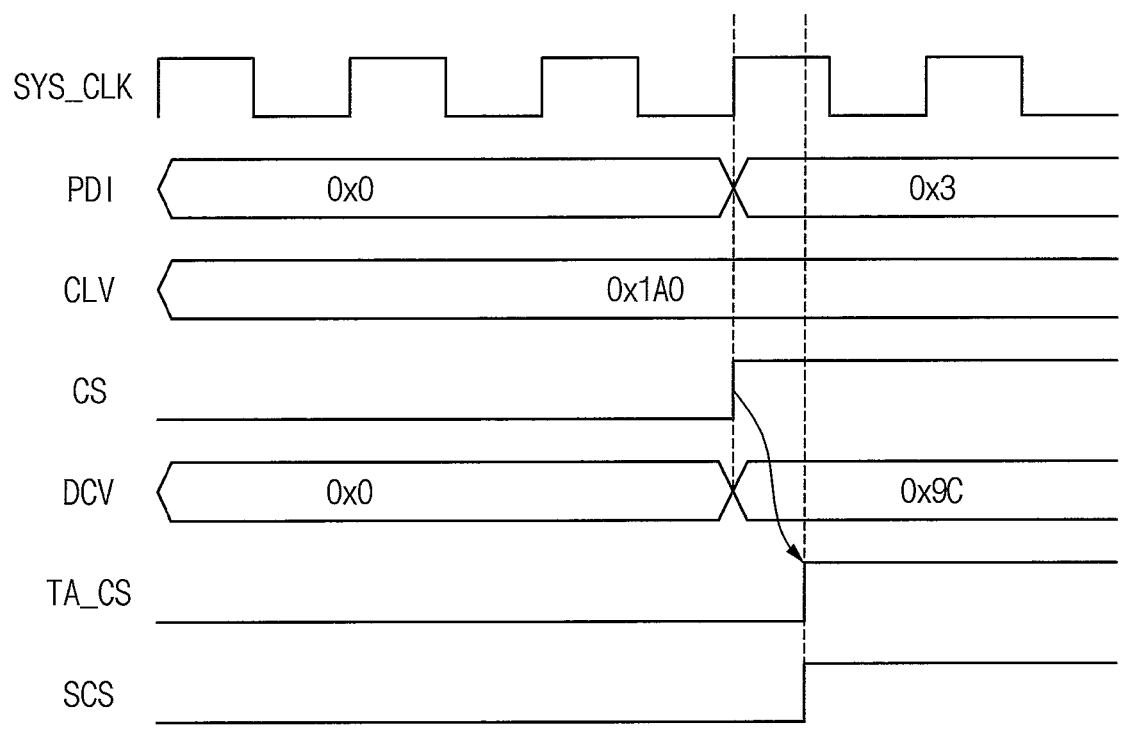
FIG. 8 is a timing diagram for describing an example of an operation of a memory interface included in a memory controller according to example embodiments of the present disclosure.

FIG. 7 is a block diagram illustrating a memory interface included in a memory controller according to example embodiments of the present disclosure, and FIG. 8 is a timing diagram for describing an example of an operation of a memory interface included in a memory controller according to example embodiments of the present disclosure.

Referring to FIG. 7, a memory interface 130a may include a phase control circuit 132a and a phase application circuit 134a. In some example embodiments of the present disclosure, the memory interface 130a may further include a flip-flop 136 and a delay locked loop circuit 140.

The delay locked loop circuit 140 may receive a system clock signal SYS_CLK, and may generate a clock lock value CLV corresponding to a cycle time (or one period) of the system clock signal SYS_CLK. In some example embodiments of the present disclosure, the clock lock value CLV may be linearly proportional to the cycle time of the system clock signal SYS_CLK.

The phase control circuit 132a may generate a delay control value DCV based on phase difference information PDI. In some example embodiments of the present disclosure, the phase control circuit 132a may receive the clock lock value CLV corresponding to the cycle time of the system clock signal SYS_CLK, and may calculate the delay control value DCV based on a phase difference represented by the phase difference information PDI, a resolution value of the phase difference and the clock lock value CLV. For example, the phase control circuit 132a may calculate the delay control value DCV by using an equation, "DCV=(PD/PRV)*CLV", where DCV represents the delay control value, PD represents the phase difference represented by the phase difference information PDI, PRV represents the resolution value of the phase difference, and CLV represents the clock lock value. For example, as illustrated in FIG. 8, in a case where the phase difference represented by the phase difference information PDI is '3', the resolution value of the phase difference is '8', and the clock lock value CLV is '0×1A02, or '416', the phase control circuit 132a may determine the delay control value DCV as (3/8)*416', or '156' (or '0×9C').

The flip-flop 136 may capture a command signal CS output from a command generator in response to the system clock signal SYS_CLK, and may output the command signal CS to the phase application circuit 134a. The phase application circuit 134a may generate a timing adjusted command signal TA_CS by adjusting a timing of the command signal CS based on the delay control value DCV received from the phase control circuit 132a. In some example embodiments of the present disclosure, the phase application circuit 134a may include a delay line 160 that delays the command signal CS by a delay time corresponding to the phase difference represented by the phase difference information PDI based on the delay control value DCV. For example, as illustrated in FIG. 8, in a case where the delay line 160 receives the delay control value DCV of '156', the delay line 160 may generate the timing adjusted command signal TA_CS by delaying the command signal CS by the delay time corresponding to the delay control value DCV of '156'. Further, the delay control value DCV of '156' may correspond to the phase difference between the command signal CS and a standard command signal SCS, and the timing adjusted command signal TA_CS generated based on the delay control value DCV of '156' may have substantially the same timing as the standard command signal SCS.

Figure 9:
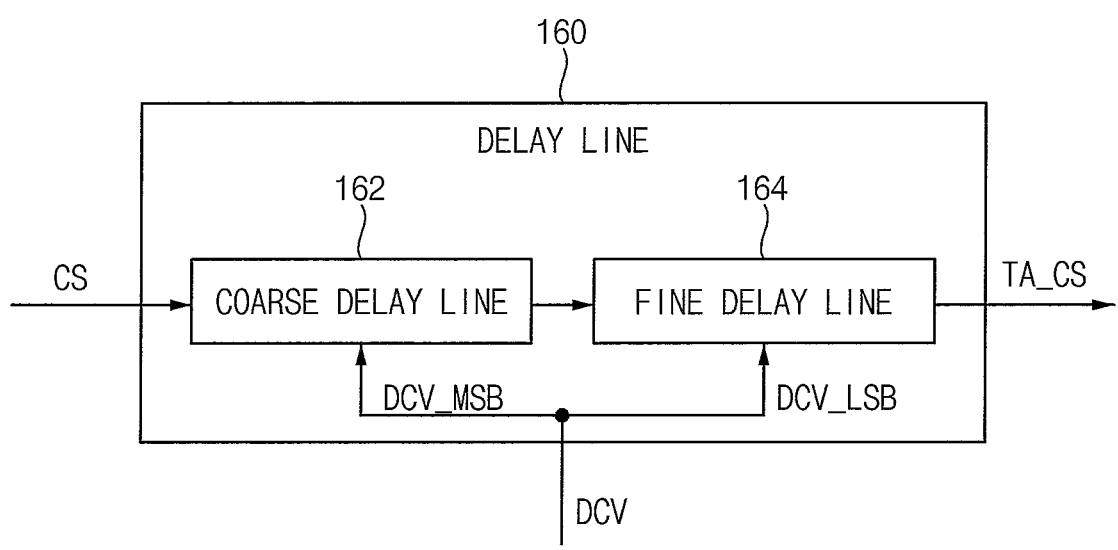
FIG. 9 is a block diagram illustrating an example of a delay line included in a memory interface of FIG. 7.

FIG. 9 is a block diagram illustrating an example of a delay line included in a memory interface of FIG. 7.

Referring to FIG. 9, a delay line 160 of the memory interface 130a may generate a timing adjusted command signal TA_CS by delaying a command signal CS based on a delay control value DCV. In some example embodiments of the present disclosure, the delay line 160 may include a coarse delay line 162 that delays the command signal CS by a first interval in response to at least one most significant bit DCV MSB of the delay control value DCV, and a fine delay line 164 that delays the command signal CS by a second interval narrower than the first interval in response to at least one least significant bit DCV LSB of the delay control value DCV. For example, the delay control value DCV may have eight bits, the coarse delay line 162 may delay the command signal CS by a relatively long interval in response to five most significant bits DCV MSB of the delay control value DCV, and the fine delay line 164 may delay the command signal CS by a relatively short interval in response to three least significant bits DCV LSB of the delay control value DCV.

Figure 10:
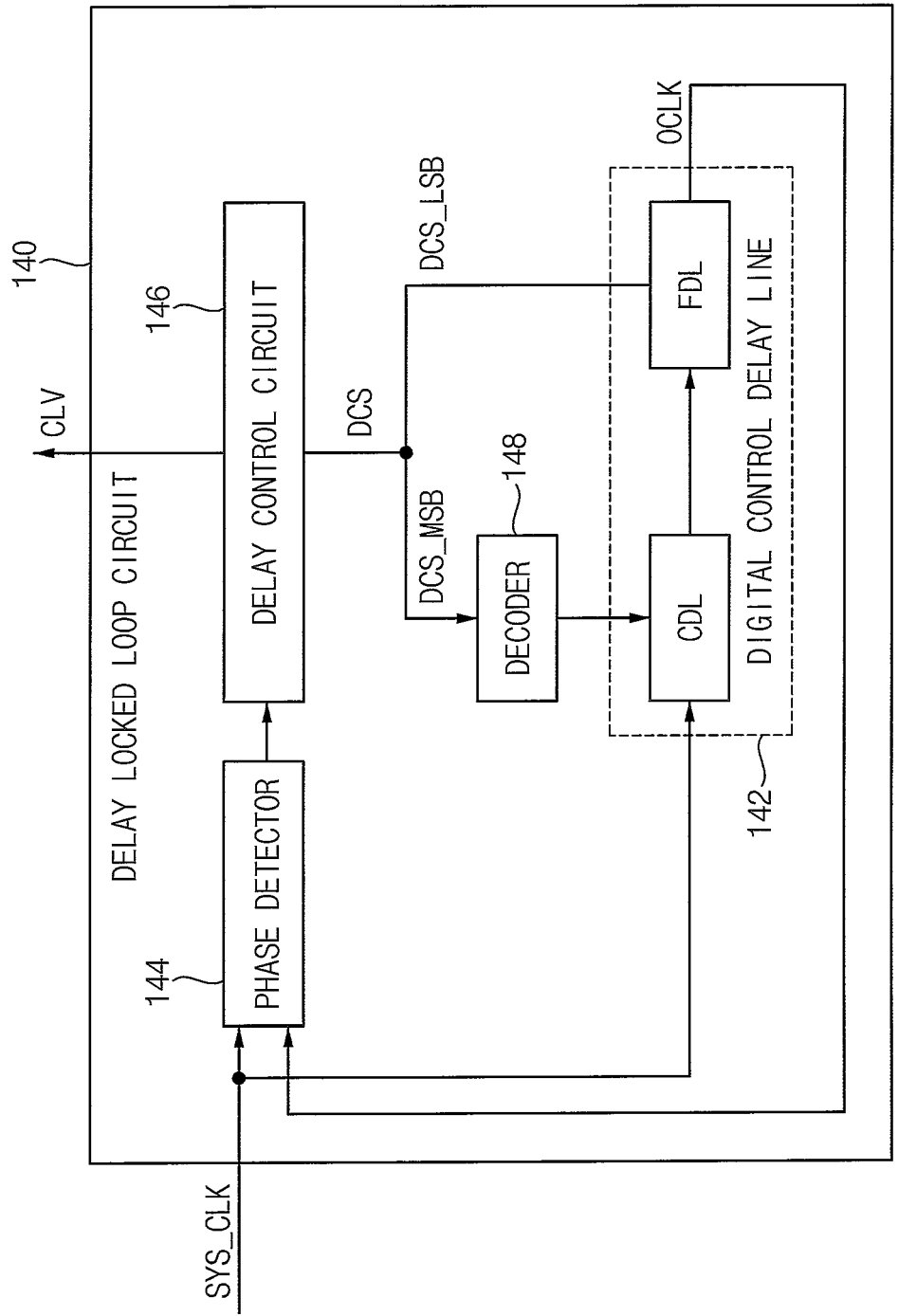
FIG. 10 is a block diagram illustrating an example of a delayed locked loop circuit included in a memory interface of FIG. 7.

FIG. 10 is a block diagram illustrating an example of a delayed locked loop circuit included in a memory interface of FIG. 7.

Referring to FIG. 10, a delay locked loop circuit 140 of the memory interface 130a may perform a delay locked loop operation on a system clock signal SYS_CLK, and may generate a clock lock value CLV corresponding to a cycle time (or one period) of the system clock signal SYS_CLK. The delay locked loop circuit 140 may include a digital control delay line 142, a phase detector 144 and a delay control circuit 146. In some example embodiments of the present disclosure, the delay locked loop circuit 140 may further include a decoder 148.

The digital control delay line 142 may generate an output clock signal OCLK by delaying the system clock signal SYS_CLK. A delay time of the digital control delay line 142 may be controlled by a delay control signal DCS of the delay control circuit 146. In some example embodiments of the present disclosure, the digital control delay line 142 may include a coarse delay line CDL that delays the system clock signal SYS_CLK by a relatively long interval, and a fine delay line FDL that delays the system clock signal SYS_CLK by a relatively short interval. A delay time of the coarse delay line CDL may be controlled by one or more most significant bits DCS MSB of the delay control signal DCS, and a delay time of the fine delay line FDL may be controlled by one or more least significant bits DCS_LSB of the delay control signal DCS. In some example embodiments of the present disclosure, the most significant bits DCS MSB of the delay control signal DCS provided to the coarse delay line CDL may be decoded by the decoder 148.

The phase detector 144 may detect a phase difference between the system clock signal SYS_CLK and the output clock signal OCLK. The phase detector 144 may provide the delay control circuit 146 with information about whether the output clock signal OCLK leads or lags the system clock signal SYS_CLK. In other words, the phase detector 144 may provide the delay control circuit 146 with information about whether the output clock signal OCLK is faster or slower than the system clock signal SYS_CLK.

The delay control circuit 146 may generate the delay control signal DCS for controlling the delay time of the digital control delay line 142 based on the phase difference detected by the phase detector 144. Further, the delay control circuit 146 may generate the clock lock value CLV corresponding to the cycle time of the system clock signal SYS_CLK. For example, the delay control circuit 146 may generate the delay control signal DCS for the digital control delay line 142 to delay the system clock signal SYS_CLK by one cycle (or one period), and may output a value of the delay control signal DCS as the clock lock value CLV.

Figure 11:
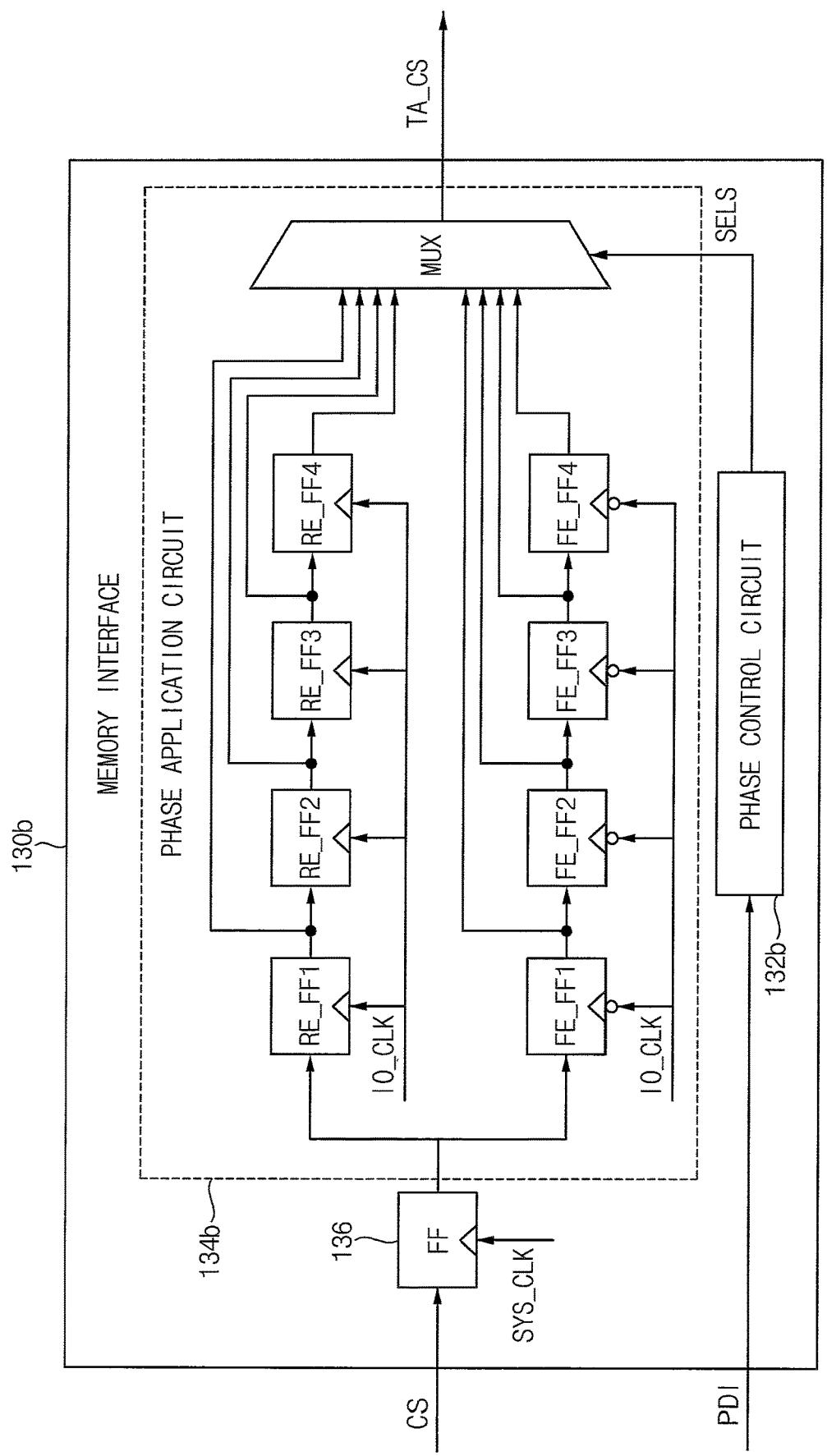
FIG. 11 is a block diagram illustrating a memory interface included in a memory controller according to example embodiments of the present disclosure.
Figure 12:
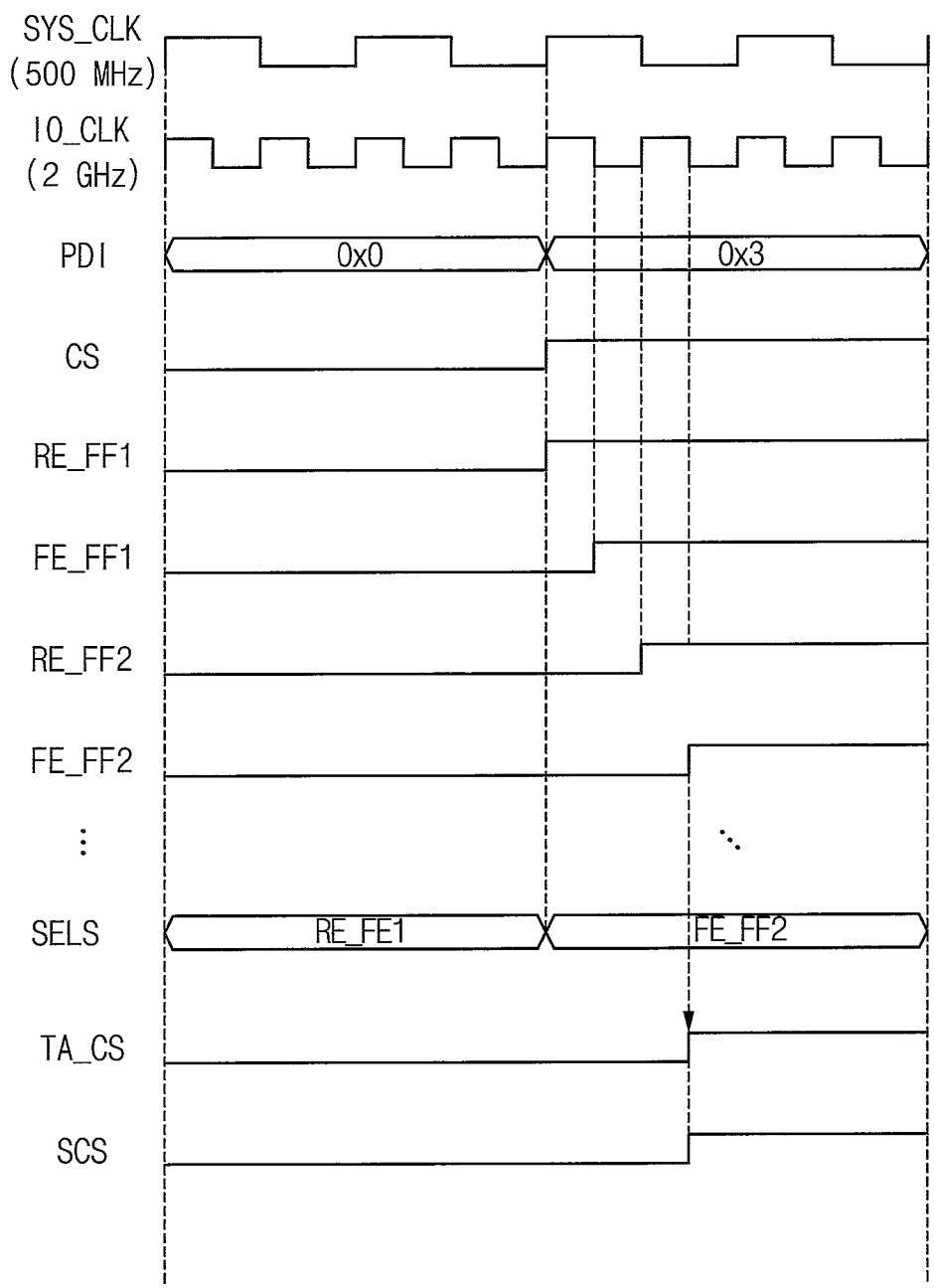
FIG. 12 is a timing diagram for describing an example of an operation of a memory interface included in a memory controller according to example embodiments of the present disclosure.

FIG. 11 is a block diagram illustrating a memory interface included in a memory controller according to example embodiments of the present disclosure, and FIG. 12 is a timing diagram for describing an example of an operation of a memory interface included in a memory controller according to example embodiments of the present disclosure.

Referring to FIG. 11, a memory interface 130b may include a phase control circuit 132b and a phase application circuit 134b. In some example embodiments of the present disclosure, the memory interface 130b may further include a flip-flop 136.

The phase control circuit 132b may generate a select signal SELS based on phase difference information PDI. The phase control circuit 132b may provide the select signal SELS to the phase application circuit 134b. The phase application circuit 134b may output a timing adjusted command signal TA_CS having a timing substantially the same as a standard command signal in response to the select signal SELS. In some example embodiments of the present disclosure, the phase application circuit 134b may include a plurality of flip-flops RE_FF1, RE_FF2, RE_FF3, RE_FF4, FE_FF1, FE_FF2, FE_FF3 and FE_FF4 and a multiplexer MUX.

The plurality of flip-flops RE_FF1 through RE_FF4 and FE_FF1 through FE_FF4 may capture a command signal CS in response to an input/output clock signal IO_CLK. In some example embodiments of the present disclosure, the input/output clock signal IO_CLK may be generated by a clock generator 150 illustrated in FIG. 1. Further, a frequency of the input/output clock signal IO_CLK may be higher than a frequency of a system clock signal SYS_CLK, and a cycle time (or a period) of the input/output clock signal IO_CLK may be shorter than a cycle time (or a period) of the system clock signal SYS_CLK. In some example embodiments of the present disclosure, the plurality of flip-flops RE_FF1 through RE_FF4 and FE_FF1 through FE_FF4 may include a plurality of rising edge-triggered flip-flops RE_FF1 through RE_FF4 that captures the command signal CS in response to a rising edge of the input/output clock signal IO_CLK, and a plurality of falling edge-triggered flip-flops FE_FF1 through FE_FF4 that captures the command signal CS in response to a falling edge of the input/output clock signal IO_CLK. Further, the plurality of rising edge-triggered flip-flops RE_FF1 through RE_FF4 may be connected in series with each other, and the plurality of falling edge-triggered flip-flops FE_FF1 through FE_FF4 may be connected in series with each other. Thus, the plurality of rising edge-triggered flip-flops RE_FF1 through RE_FF4 may sequentially shift and output the command signal CS at each rising edge of the input/output clock signal IO_CLK, and the plurality of falling edge-triggered flip-flops FE_FF1 through FE_FF4 may sequentially shift and output the command signal CS at each falling edge of the input/output clock signal IO_CLK.

The multiplexer MUX may select, as the timing adjusted command signal TA_CS transmitted to a memory device, e.g., the memory device 200 of FIG. 1, one of output signals of the plurality of flip-flops RE_FF1 through RE_FF4 and FE_FF1 through FE_FF4 in response to the select signal SELS, and may output the selected signal.

For example, as illustrated in FIG. 12, a frequency of the system clock signal SYS_CLK may be about 500 MHz, and a frequency of the input/output clock signal IO_CLK may be about 2 GHz. Further, as illustrated in FIG. 12, when the command signal CS is changed to a high level, a first rising edge-triggered flip-flop RE_FF1 may output the command signal CS at a first rising edge of the input/output clock signal IO_CLK, a first falling edge-triggered flip-flop FE_FF1 may output the command signal CS at a first falling edge of the input/output clock signal IO_CLK, a second rising edge-triggered flip-flop RE_FF2 may output the command signal CS at a second rising edge of the input/output clock signal IO_CLK, and a second falling edge-triggered flip-flop FE_FF2 may output the command signal CS at a second falling edge of the input/output clock signal IO_CLK. Similarly, a third rising edge-triggered flip-flop RE_FF3 may output the command signal CS at a third rising edge of the input/output clock signal IO_CLK, and a third falling edge-triggered flip-flop FE_FF3 may output the command signal CS at a third falling edge of the input/output clock signal IO_CLK, and so forth. In a case where the phase difference information PDI has a value of '0', the phase control circuit 132b may generate the select signal SELS which indicates that the first rising edge-triggered flip-flop RE_FF1 corresponding to the phase difference information PDI has the value of '0'. Alternatively, in a case where the phase difference information PDI has a value of '3', the phase control circuit 132b may generate the select signal SELS which indicates that the second falling edge-triggered flip-flop FE_FF2 corresponding to the phase difference information PDI has the value of '3'. The multiplexer MUX may select the command signal CS output from the second falling edge-triggered flip-flop FE_FF2 as the timing adjusted command signal TA_CS transmitted to the memory device in response to the select signal SELS indicating the second falling edge-triggered flip-flop FE_FF2. Accordingly, the timing adjusted command signal TA_CS output from the multiplexer MUX may have substantially the same timing as the standard command signal SCS, FIG. 13 is a block diagram illustrating a memory controller according to example embodiments of the present disclosure.

Figure 13:
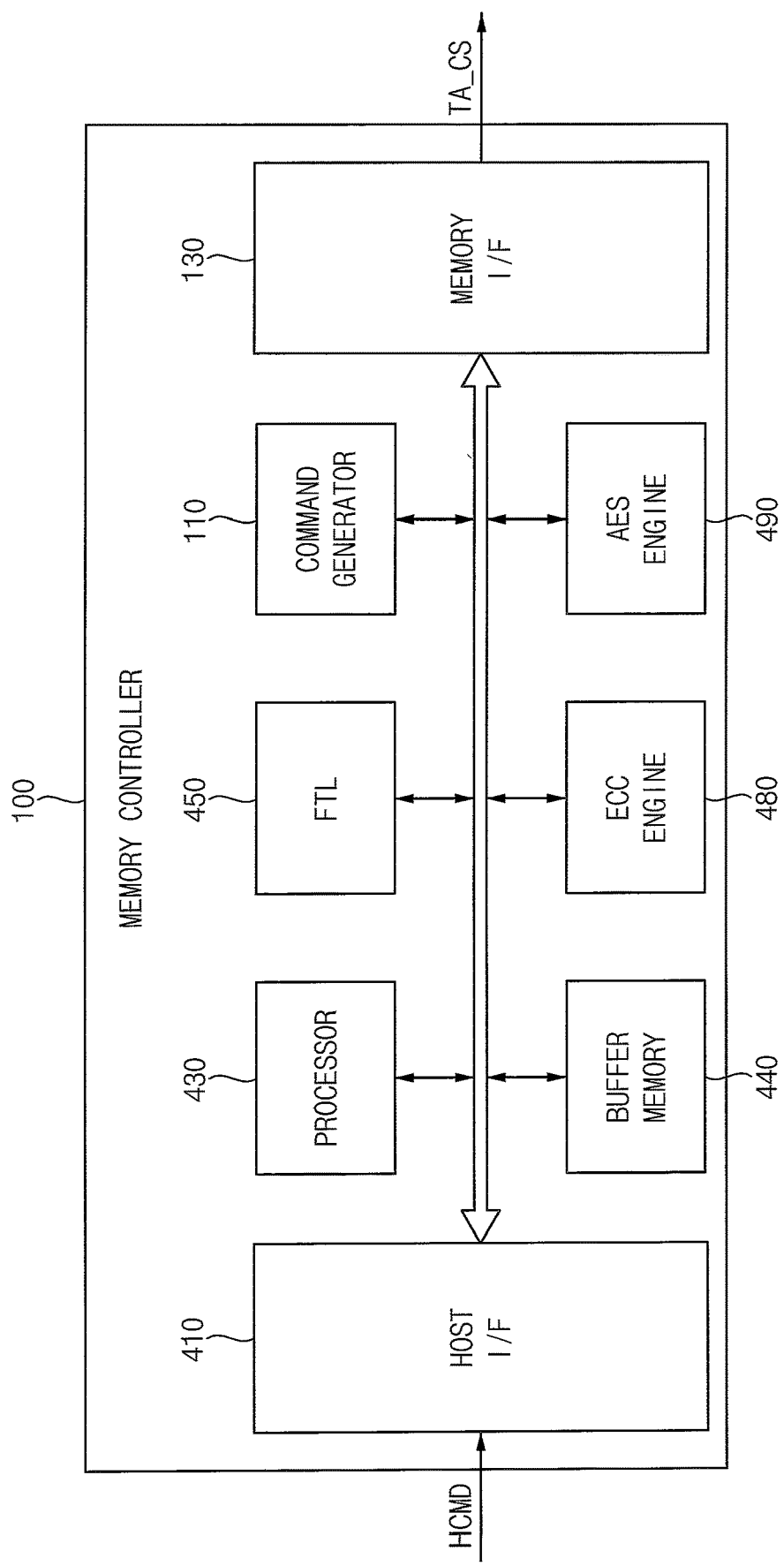
FIG. 13 is a block diagram illustrating a memory controller according to example embodiments of the present disclosure.

Referring to FIG. 13, a memory controller 100 may include a host interface 410, a command generator 110, a memory interface 130 and a processor 430. The memory controller 100 may further include a flash translation layer (FTL) 450, a buffer memory 440, an error correction code (ECC) engine 480 and an advanced encryption standard (AES) engine 490. The memory controller 100 may further include a working memory in which the FTL 450 is loaded, and the processor 430 may execute the FTL 450 to control data write and read operations on a memory device. The components of the memory controller 100 may communicate with each other via a bus.

The host interface 410 may transmit and receive packets to and from a host. A packet transmitted from the host to the host interface 410 may include a host command HCMD or data to be written to the memory device. A packet transmitted from the host interface 410 to the host may include a response to the host command HCMD or data read from the memory device. The memory interface 130 may transmit data to be written to the memory device to the memory device, or may receive data read from the memory device. The memory interface 130 may be configured to comply with a standard protocol, such as Toggle or open NAND flash interface (ONFI).

The processor 430 may control an operation of the memory controller 100 in response to the host command HCMD received through the host interface 410. The buffer memory 440 may store a command and data executed and processed by the processor 430. For example, the buffer memory 440 may include a volatile memory device, such as a dynamic random access memory (DRAM), a static random access memory (SRAM), etc.

The FTL 450 may perform various functions, such as an address mapping operation, a wear-leveling operation, and a garbage collection operation. The address mapping operation may be an operation of converting a logical address received from the host into a physical address used to actually store data in the memory device. The wear-leveling operation may be a technique for preventing excessive deterioration of a specific block by allowing blocks of the memory device to be uniformly used. As an example, the wear-leveling operation may be implemented using a firmware technique that balances erase counts of physical blocks. The garbage collection operation may be a technique for ensuring usable capacity in the memory device by erasing an existing block after copying valid data of the existing block to a new block.

The ECC engine 480 may perform error detection and correction operations on read data read from the memory device. For example, the ECC engine 480 may generate parity bits for write data to be written to the memory device, and the generated parity bits may be stored in the memory device together with write data. During the reading of data from the memory device, the ECC engine 480 may correct an error in the read data by using the parity bits read from the memory device along with the read data, and output error-corrected read data.

The AES engine 490 may perform at least one of an encryption operation and a decryption operation on data input to the memory controller 100 by using a symmetric-key algorithm.

The command generator 110 may generate a command signal representing a command for the memory device in response to the host command HCMD. A timing of the command signal generated by the command generator 110 may be adjusted by the memory interface 130, and the memory controller 100 may provide a timing adjusted command signal TA_CS to the memory device.

Figure 14:
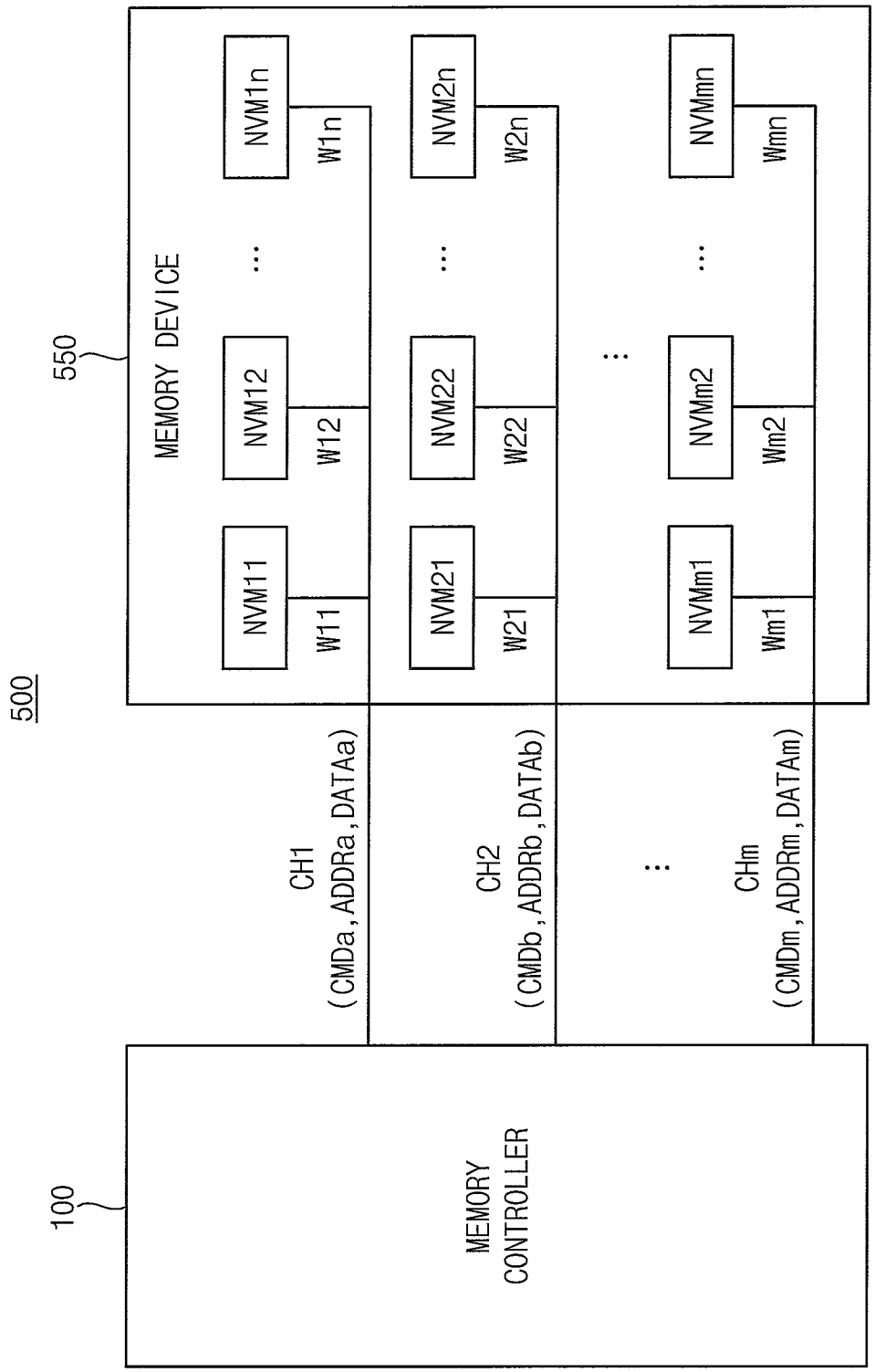
FIG. 14 is a block diagram illustrating a memory system including a memory controller according to example embodiments of the present disclosure.

FIG. 14 is a block diagram illustrating a memory system including a memory controller according to example embodiments of the present disclosure.

Referring to FIG. 14, a memory system 500 may include a memory controller 100 and a memory device 550. The memory system 500 may support a plurality of channels CH1 to CHm, and the memory device 550 may be connected to the memory controller 100 through the plurality of channels CH1 to CHm. For example, the memory system 500 may be implemented as a storage device, such as an SSD.

The memory device 550 may include a plurality of nonvolatile memory devices NVM11 to NVMmn. Each of the nonvolatile memory devices NVM11 to NVMmn may be connected to one of the plurality of channels CH1 to CHm through a way corresponding thereto. For instance, the nonvolatile memory devices NVM11 to NVM1n may be connected to a first channel CH1 through ways W11 to W1n, and the nonvolatile memory devices NVM21 to NVM2n may be connected to a second channel CH2 through ways W21 to W2n. In addition, the nonvolatile memory devices NVMm1 to NVMmn may be connected to an m-th channel CHm through ways Wm1 to Wmn. In an example embodiment of the present disclosure, each of the nonvolatile memory devices NVM11 to NVMmn may be implemented as an arbitrary memory unit that may operate according to an individual command from the memory controller 100. For example, each of the nonvolatile memory devices NVM11 to NVMmn may be implemented as a chip or a die, but the present disclosure is not limited thereto.

The memory controller 100 may transmit and receive signals to and from the memory device 550 through the plurality of channels CH1 to CHm. For example, the memory controller 100 may transmit commands CMDa to CMDm, addresses ADDRa to ADDRm, and data DATAa to DATAm to the memory device 550 through the channels CH1 to CHm or receive the data DATAa to DATAm from the memory device 550.

The memory controller 100 may select one of the nonvolatile memory devices NVM11 to NVMmn, which is connected to one of the channels CH1 to CHm, by using a corresponding one of the channels CH1 to CHm, and transmit and receive signals to and from the selected nonvolatile memory device. For example, the memory controller 100 may select the nonvolatile memory device NVM11 from the nonvolatile memory devices NVM11 to NVM1n connected to the first channel CH1. The memory controller 100 may transmit the command CMDa, the address ADDRa, and the data DATAa to the selected nonvolatile memory device NVM11 through the first channel CH1 or receive the data DATAa from the selected nonvolatile memory device NVM11.

The memory controller 100 may transmit and receive signals to and from the memory device 550 in parallel through different channels. For example, the memory controller 100 may transmit a command CMDb to the memory device 550 through the second channel CH2 while transmitting a command CMDa to the memory device 550 through the first channel CH1. For example, the memory controller 100 may receive data DATAb from the memory device 550 through the second channel CH2 while receiving data DATAa from the memory device 550 through the first channel CH1.

The memory controller 100 may control all operations of the memory device 550, The memory controller 100 may transmit a signal to the channels CH1 to CHm and control each of the nonvolatile memory devices NVM11 to NVMmn connected to the channels CH1 to CHm. For instance, the memory controller 100 may transmit the command CMDa and the address ADDRa to the first channel CH1 and control one nonvolatile memory device selected from the nonvolatile memory devices NVM11 to NVM1n.

Each of the nonvolatile memory devices NVM11 to NVMmn may operate via the control of the memory controller 100. For example, the nonvolatile memory device NVM11 may program the data DATAa based on the command CMDa, the address ADDRa, and the data DATAa provided to the first channel CH1. For example, the nonvolatile memory device NVM21 may read the data DATAb based on the command CMDb and the address ADDRb provided to the second channel CH2 and transmit the read data DATAb to the memory controller 100.

Although FIG. 14 illustrates an example in which the memory device 550 communicates with the memory controller 100 through m channels and includes n nonvolatile memory devices corresponding to each of the channels, the number of channels and the number of nonvolatile memory devices connected to one channel may be variously changed. Further, although FIG. 14 illustrates an example in which the memory device 550 includes the nonvolatile memory devices NVM11 to NVMam, the memory device 550 may include any memory device, for example a volatile memory device.

FIG. 15 is a block diagram for describing signals transferred between a memory controller and a memory device in a memory system according to example embodiments of the present disclosure.

Referring to FIG. 15, a memory system 600 may include a memory device 300 and a memory controller 100. The memory device 300 may correspond to one of nonvolatile memory devices NVM11 to NVMmn, which communicate with a memory controller 100 based on one of the plurality of channels CH1 to CHm of FIG. 14. The memory controller 100 may correspond to a memory controller 100 of FIG. 1 or a memory controller 100 of FIG. 13.

The memory device 300 may include first, second, third, fourth, fifth, sixth, seventh and eighth pins PI1, P12, P13, P14, P15, P16, P17 and P18, an interface circuitry 310, a control logic circuitry 320 and a memory cell array 330.

The interface circuitry 310 may receive a chip enable signal CEB from the memory controller 100 through the first pin P11. The interface circuitry 310 may transmit and receive signals to and from the memory controller 100 through the second to eighth pins P12 to P18 in response to the chip enable signal CEB. For example, when the chip enable signal CEB is in an enable state (e.g., a low level), the interface circuitry 310 may transmit and receive signals to and from the memory controller 100 through the second to eighth pins P12 to P18.

The interface circuitry 310 may receive a command latch enable signal CLE, an address latch enable signal ALE, and a write enable signal WEB from the memory controller 100 through the second to fourth pins P12 to P14. The interface circuitry 310 may receive a data signal DQ from the memory controller 100 through the seventh pin P17 or transmit the data signal DQ to the memory controller 100. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The interface circuitry 310 may obtain the command CMD from the data signal DQ, which is received in an enable section (e.g., a high-level state) of the command latch enable signal CLE based on toggle time points of the write enable signal WEB. The interface circuitry 310 may obtain the address ADDR from the data signal DQ, which is received in an enable section (e.g., a high-level state) of the address latch enable signal ALE based on the toggle time points of the write enable signal WEB.

In an example embodiment of the present disclosure, the write enable signal WEB may be maintained at a static state (e.g., a high level or a low level) and toggle between the high level and the low level. For example, the write enable signal WEB may toggle in a section in which the command CMD or the address ADDR is transmitted. Thus, the interface circuitry 310 may obtain the command CMD or the address ADDR based on toggle time points of the write enable signal WEB.

The interface circuitry 310 may receive a read enable signal REB from the memory controller 100 through the fifth pin P15. The interface circuitry 310 may receive a data strobe signal DQS from the memory controller 100 through the sixth pin P16 or transmit the data strobe signal DQS to the memory controller 100.

In a data (DATA) output operation of the memory device 300, the interface circuitry 310 may receive the read enable signal REB, which toggles through the fifth pin P15, before outputting the data DATA. The interface circuitry 310 may generate the data strobe signal DQS, which toggles based on the toggling of the read enable signal REB. For example, the interface circuitry 310 may generate a data strobe signal DQS, which starts toggling after a predetermined delay (e.g., tDQSRE), based on a toggling start time of the read enable signal REB. The interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 100.

In a data (DATA) input operation of the memory device 300, when the data signal DQ including the data DATA is received from the memory controller 100, the interface circuitry 310 may receive the data strobe signal DQS, which toggles, along with the data DATA from the memory controller 100. The interface circuitry 310 may obtain the data DATA from the data signal DQ based on toggle time points of the data strobe signal DQS. For example, the interface circuitry 310 may sample the data signal DQ at rising and falling edges of the data strobe signal DQS and obtain the data DATA.

The interface circuitry 310 may transmit a ready/busy output signal R/B to the memory controller 100 through the eighth pin P18. The interface circuitry 310 may transmit state information of the memory device 300 through the ready/busy output signal R/B to the memory controller 100. When the memory device 300 is in a busy state (e.g., when operations are being performed in the memory device 300), the interface circuitry 310 may transmit a ready/busy output signal R/B indicating the busy state to the memory controller 100. When the memory device 300 is in a ready state (e.g., when operations are not performed or completed in the memory device 300), the interface circuitry 310 may transmit a ready/busy output signal R/B indicating the ready state to the memory controller 100. For example, while the memory device 300 is reading data DATA from the memory cell array 330 in response to a page read command, the interface circuitry 310 may transmit a ready/busy output signal R/B indicating a busy state (e.g., a low level) to the memory controller 100. For example, while the memory device 300 is programming data DATA to the memory cell array 330 in response to a program command, the interface circuitry 310 may transmit a ready/busy output signal R/B indicating the busy state to the memory controller 100.

The control logic circuitry 320 may control all operations of the memory device 300. The control logic circuitry 320 may receive the command/address CMD/ADDR obtained from the interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the interface circuitry 310, via the control of the control logic circuitry 320. The memory cell array 330 may output the stored data DATA to the interface circuitry 310 via the control of the control logic circuitry 320.

The memory cell array 330 may include a plurality of memory cells. For example, the plurality of memory cells may be flash memory cells. However, the present disclosure is not limited thereto, and the memory cells may be resistive random access memory (RRAM) cells, ferroelectric random access memory (FRAM) cells, phase change random access memory (PRAM) cells, thyristor random access memory (TRAM) cells, or magnetic random access memory (MRAM) cells. Hereinafter, an embodiment of the present disclosure in which the memory cells are NAND flash memory cells will mainly be described.

The memory controller 100 may include first, second, third, fourth, fifth, sixth, seventh and eighth pins P21, P22, P23, P24, P25, P26, P27 and P28 and a memory interface 130. The first to eighth pins P21 to P28 may respectively correspond to the first to eighth pins P11 to P18 of the memory device 300.

The memory interface 130 may transmit a chip enable signal CEB to the memory device 300 through the first pin P21. The memory interface 130 may transmit and receive signals to and from the memory device 300, which is selected by the chip enable signal CEB, through the second to eighth pins P22 to P28.

The memory interface 130 may transmit the command latch enable signal CLE, the address latch enable signal ALE, and the write enable signal WEB to the memory device 300 through the second to fourth pins P22 to P24. The memory interface 130 may transmit or receive the data signal DQ to and from the memory device 300 through the seventh pin P27.

The memory interface 130 may transmit the data signal DQ including the command CMD or the address ADDR to the memory device 300 along with the write enable signal WEB, which toggles. The memory interface 130 may transmit the data signal DQ including the command CMD to the memory device 300 by transmitting a command latch enable signal CLB having an enable state. In addition, the memory interface 130 may transmit the data signal DQ including the address ADDR to the memory device 300 by transmitting an address latch enable signal ALE having an enable state.

The memory controller 100 according to example embodiments of the present disclosure may adjust a timing of the write enable signal WEB, the address latch enable signal ALE, the command latch enable signal CLE and/or the data signal DQ for transferring the command CMD and/or the address ADDR. As a consequence, the write enable signal WEB, the address latch enable signal ALE, the command latch enable signal CLE and/or the data signal DQ for transferring the command CMD and/or the address ADDR may have no or almost no timing overhead.

The memory interface 130 may transmit the read enable signal REB to the memory device 300 through the fifth pin P25. The memory interface 130 may receive or transmit the data strobe signal DQS from or to the memory device 300 through the sixth pin P26.

In a data (DATA) output operation of the memory device 300, the memory interface 130 may generate a read enable signal REB, which toggles, and transmit the read enable signal REB to the memory device 300. For example, before outputting data DATA, the memory interface 130 may generate a read enable signal REB, which is changed from a static state (e.g., a high level or a low level) to a toggling state. Thus, the memory device 300 may generate a data strobe signal DQS, which toggles, based on the read enable signal REB. The memory interface 130 may receive the data signal DQ including the data DATA along with the data strobe signal DQS, which toggles, from the memory device 300. The memory interface 130 may obtain the data DATA from the data signal DQ based on a toggle time point of the data strobe signal DQS.

In a data (DATA) input operation of the memory device 300, the memory interface 130 may generate a data strobe signal DQS, which toggles. For example, before transmitting data DATA, the memory interface 130 may generate a data strobe signal DQS, which is changed from a static state (e.g., a high level or a low level) to a toggling state. The memory interface 130 may transmit the data signal DQ including the data DATA to the memory device 300 based on toggle time points of the data strobe signal DQS.

The memory interface 130 may receive a ready/busy output signal R/B from the memory device 300 through the eighth pin P28. The memory interface 130 may determine state information of the memory device 300 based on the ready/busy output signal R/B.

FIG. 16 is a block diagram illustrating an example of a memory device included in a memory system according to example embodiments of the present disclosure.

Referring to FIG. 16, a memory device 300 may include a memory cell array 330, and a control circuit that performs an operation for the memory cell array 330. The control circuit may include a control logic circuitry 320, a page buffer circuit 340, a voltage generator 350 and a row decoder 360. The memory device 300 may further include an interface circuitry 310. In addition, the memory device 300 may further include column logic, a pre-decoder, a temperature sensor, a command decoder, and/or an address decoder.

The control logic circuitry 320 may control all operations of the memory device 300. The control logic circuitry 320 may output various control signals in response to commands CMD and/or addresses ADDR from the interface circuitry 310. For example, the control logic circuitry 320 may output a voltage control signal CTRL_vol, a row address X-ADDR, and a column address Y-ADDR.

The memory cell array 330 may include a plurality of memory blocks BLKI to BLKz (here, z is a positive integer), each of which may include a plurality of memory cells. The memory cell array 330 may be connected to the page buffer circuit 340 through bitlines BL and be connected to the row decoder 360 through wordlines WL, string selection lines SSL, and ground selection lines GSL.

In an example embodiment of the present disclosure, the memory cell array 330 may include a three-dimensional (3D) memory cell array, which includes a plurality of NAND strings. Each of the NAND strings may include memory cells respectively connected to wordlines vertically stacked on a substrate. The disclosures of U.S. Pat. Nos. 7,679,133; 8,553,466; 8,654,587; 8,559,235; and U.S. Patent Application Publication No. 2011/0233648 are incorporated by reference herein in their entireties. In an example embodiment of the present disclosure, the memory cell array 330 may include a two-dimensional (2D) memory cell array, which includes a plurality of NAND strings arranged in a row direction and a column direction.

The page buffer circuit 340 may include a plurality of page buffers PB1 to PBm (here, m is an integer greater than or equal to 3), which may be respectively connected to the memory cells through a plurality of bitlines BL. The page buffer circuit 340 may select at least one of the bitlines BL in response to the column address Y-ADDR. The page buffer circuit 340 may operate as a write driver or a sense amplifier according to an operation mode. For example, during a program operation, the page buffer circuit 340 may apply a bitline voltage corresponding to data to be programmed, to the selected bitline. During a read operation, the page buffer circuit 340 may sense a current or a voltage of the selected bitline BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a wordline voltage VWL.

The row decoder 360 may select one of a plurality of wordlines WL and select one of a plurality of string selection lines SSL in response to the row address X-ADDR. For example, the row decoder 360 may apply the program voltage and the program verification voltage to the selected wordline WL during a program operation and apply the read voltage to the selected word line WL during a read operation.

Figure 17:
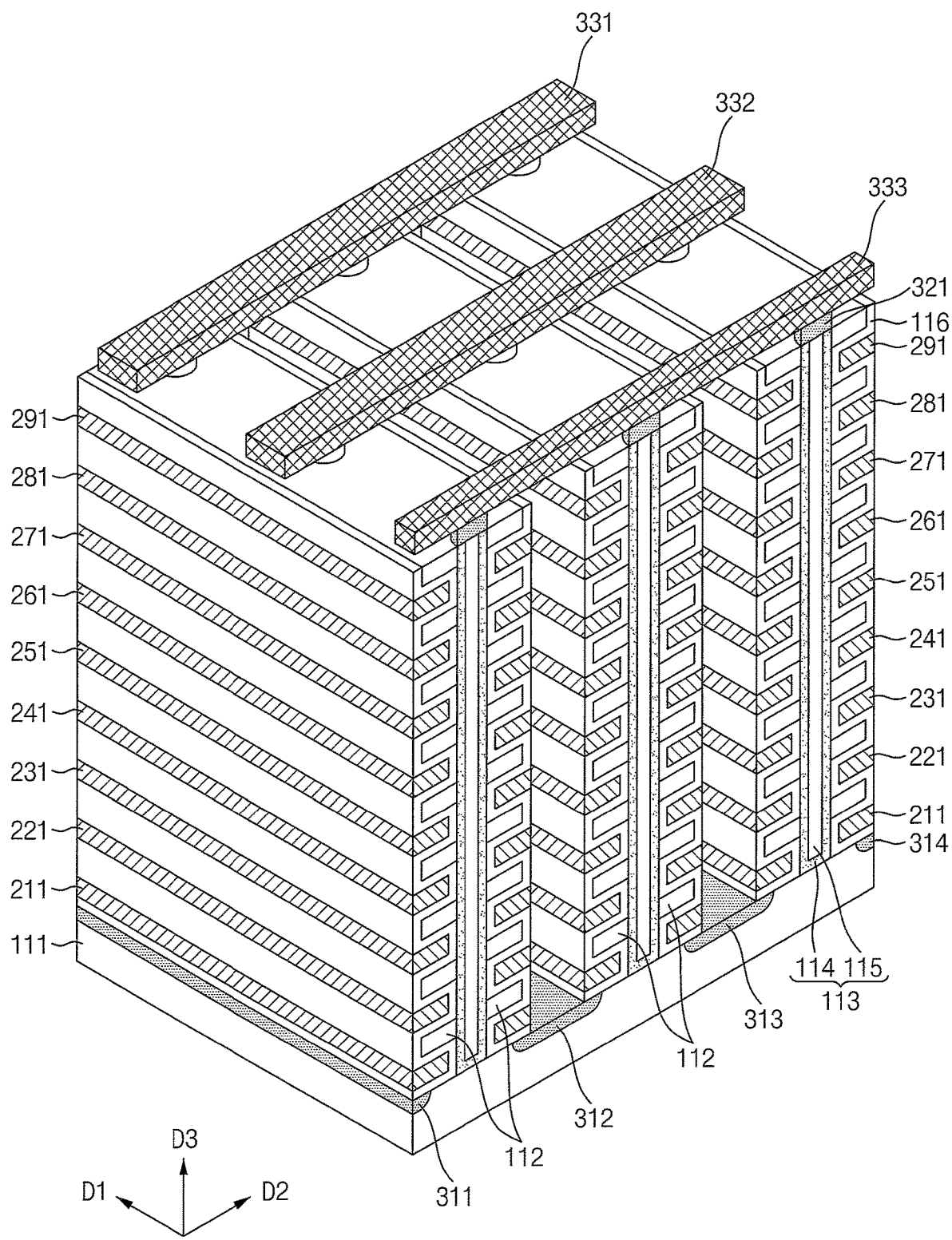
FIG. 17 is a perspective view illustrating an example of a memory block included in a memory cell array of a memory device of FIG. 16.

FIG. 17 is a perspective view illustrating an example of a memory block included in a memory cell array of a memory device of FIG. 16.

Referring to FIG. 17, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment of the present disclosure, the substrate 111 has a p-type well (or a p-type pocket well). However, the conductivity type of the substrate 111 is not limited to p-type.

A plurality of doping regions 311, 312, 313 and 314 arranged along the second direction D2 are provided in/on the substrate 111. This plurality of doping regions 311 to 314 may have a second type of charge carrier impurity (e.g., a second conductivity type) different from the first type of the substrate 111. In an embodiment of the present disclosure, the first, second, third and fourth doping regions 311 to 314 may have n-type. However, the conductivity type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include or may be formed of an insulation material such as an oxide layer.

A plurality of pillars 113 penetrating the insulation materials 112 along the third direction D3 are sequentially disposed along the first direction D1 on a region of the substrate 111 between the first and second doping regions 311 and 312. For example, the plurality of pillars 113 penetrates the insulation materials 112 to contact the substrate 111.

In some example embodiments of the present disclosure, each pillar 113 may include a plurality of materials. For example, a channel layer 114 of each pillar 113 may include or may be formed of a silicon material having a first conductivity type. For example, the channel layer 114 of each pillar 113 may include or may be formed of a silicon material having the same conductivity type as the substrate 111. In one embodiment of the present disclosure, the channel layer 114 of each pillar 113 includes or is formed of p-type silicon. However, the channel layer 114 of each pillar 113 is not limited to the p-type silicon.

An internal material 115 of each pillar 113 includes an insulation material. For example, the internal material 115 of each pillar 113 may include or may be formed of an insulation material such as a silicon oxide. In some examples, the internal material 115 of each pillar 113 may include an air gap. The term "air" as discussed herein, may refer to atmospheric air, or other gases that may be present during the manufacturing process of the memory block BLKi.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated in FIG. 17. In some examples, the insulation layer 116 need not be provided between the first conductive materials 211 to 291 corresponding to ground selection lines GSL (e.g., 211) and string selection lines SSL (e.g., 291). For example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material 211 extending along the first direction D1 is provided between the insulation layer 116 at the top of a specific insulation material 112 among the insulation materials 112 and the insulation layer 116 at the bottom of the specific insulation material 112 among the insulation materials 112. For example, a plurality of first conductive materials 221, 231, 241, 251, 261, 271 and 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the present disclosure, the first conductive materials 211 to 291 may include or may be formed of a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 is provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 321 are provided on the plurality of pillars 113, respectively. The drain regions 321 may include or may be formed of silicon materials doped with a second type of charge carrier impurity. For example, the drain regions 321 may include or may be formed of silicon materials doped with an n-type dopant. In one embodiment of the present disclosure, the drain regions 321 include or are formed of n-type silicon materials. However, the drain regions 321 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 321 in a corresponding region. The drain regions 321 and the second conductive material 333 extending along the second direction D2 may be connected through each contact plug. Each contact plug may be, for example, a conductive plug formed of a conductive material such as a metal. The second conductive materials 331 to 333 may include or may be formed of metal materials. The second conductive materials 331 to 333 may include or may be formed of conductive materials such as a polysilicon.

In the example of FIG. 17, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 18:
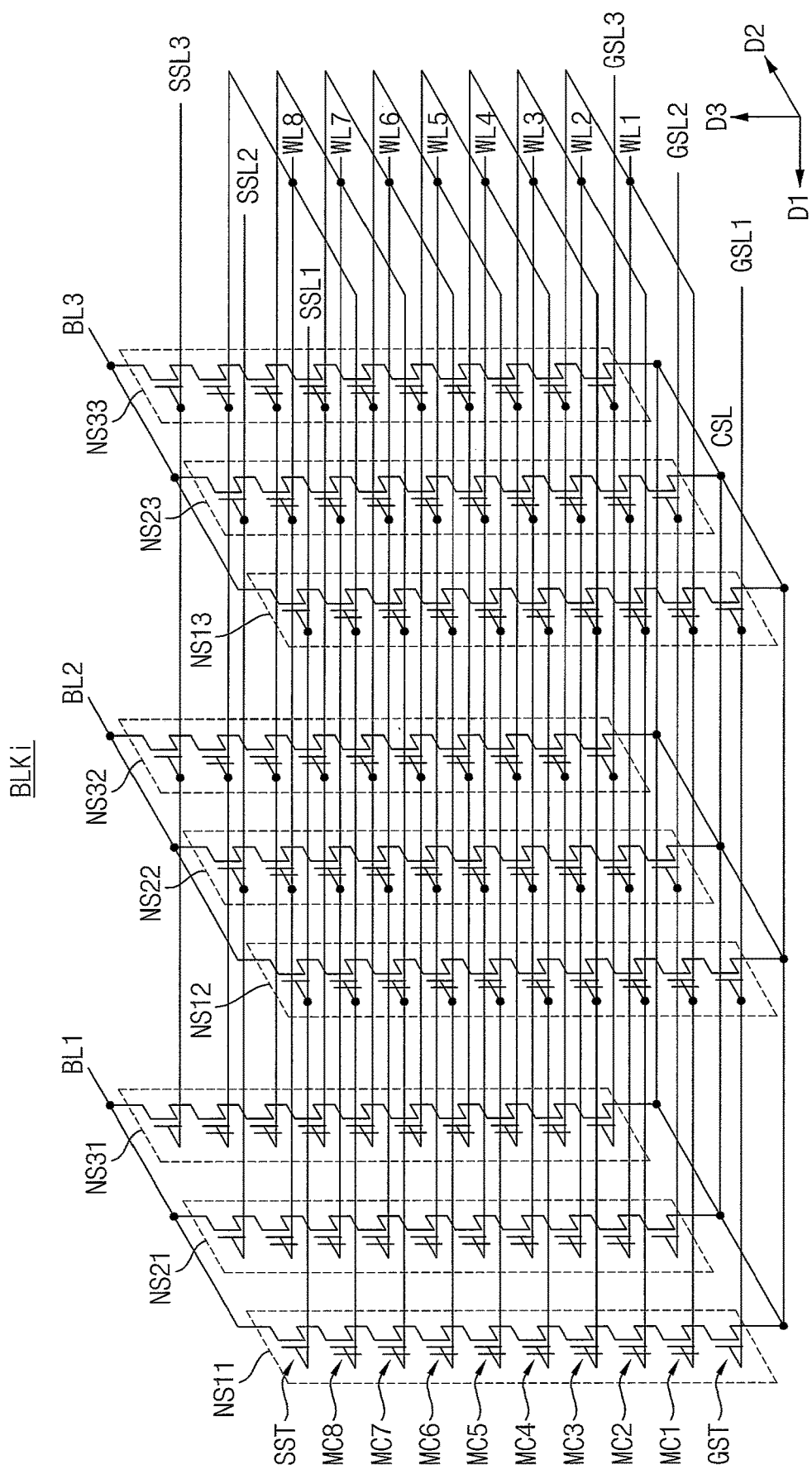
FIG. 18 is a circuit diagram illustrating an equivalent circuit of a memory block described with reference to FIG. 17.

FIG. 18 is a circuit diagram illustrating an equivalent circuit of a memory block described with reference to FIG. 17.

A memory block BLKi shown in FIG. 18 may refer to a 3D memory block having a 3D structure formed on a substrate. For example, a plurality of memory NAND strings included in the memory block BLKi may be formed in a vertical direction to the substrate.

Referring to FIG. 18, the memory block BLKi may include a plurality of memory NAND strings (e.g., NS11, NS12, NS13, NS21, NS22, NS23, NS31, NS32 and NS33), which are connected between bitlines BL1, BL2, and BL3 and a common source line CSL. Each of the memory NAND strings NS11 to NS33 may include a string selection transistor SST, a plurality of memory cells (e.g., MC1, MC2, MC3, MC4, MC5, MC6, MC7 and MC8), and a ground selection transistor GST. Each of the memory NAND strings NS11 to NS33 is illustrated as including eight memory cells MC1, MC2, MC3, MC4, MC5, MC6, MC7 and MC8 in FIG. 18, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines WL1, WL2, WL3, WLA, WL5, WL6, WL7 and WL8. Some of the word lines WL1, W12, . . . , and WL8 may correspond to dummy wordlines. The ground selection transistor GST may be connected to ground selection lines GSL1, GSL2, and GSL3 corresponding thereto. The string selection transistor SST may be connected to the bitlines BL1, BL2, and BL3 corresponding thereto, and the ground selection transistor GST may be connected to the common source line CSL.

Wordlines (e.g., WL1) at the same level may be connected in common, and the ground selection lines GSL1, GSL2, and GSL3 and the string selection lines SSL1, SSL2, and SSL3 may be separated from each other. FIG. 18 illustrates a case in which a memory block BLKi is connected to eight word lines WL1, WL2, . . . , and WL8 and three bitlines BL1, BL2, and BL3, without being limited thereto.

The number of the wordlines WL1 to WL8, the number of the bitlines BL1 to BL3, and the number of memory cells MC1 to MC8 are not limited to an example of FIG. 18.

Although the memory cell array included in the memory device according to example embodiments of the present disclosure is described based on a NAND flash memory device, the memory device according to example embodiments of the present disclosure may be any volatile memory device, such as a DRAM or an SRAM, or any nonvolatile memory device, e.g., a PRAM, an RRAM, an MRAM, a FRAM, a TRAM, a nano floating gate memory (NFGM), a polymer random access memory (PoRAM), etc.

Figure 19:
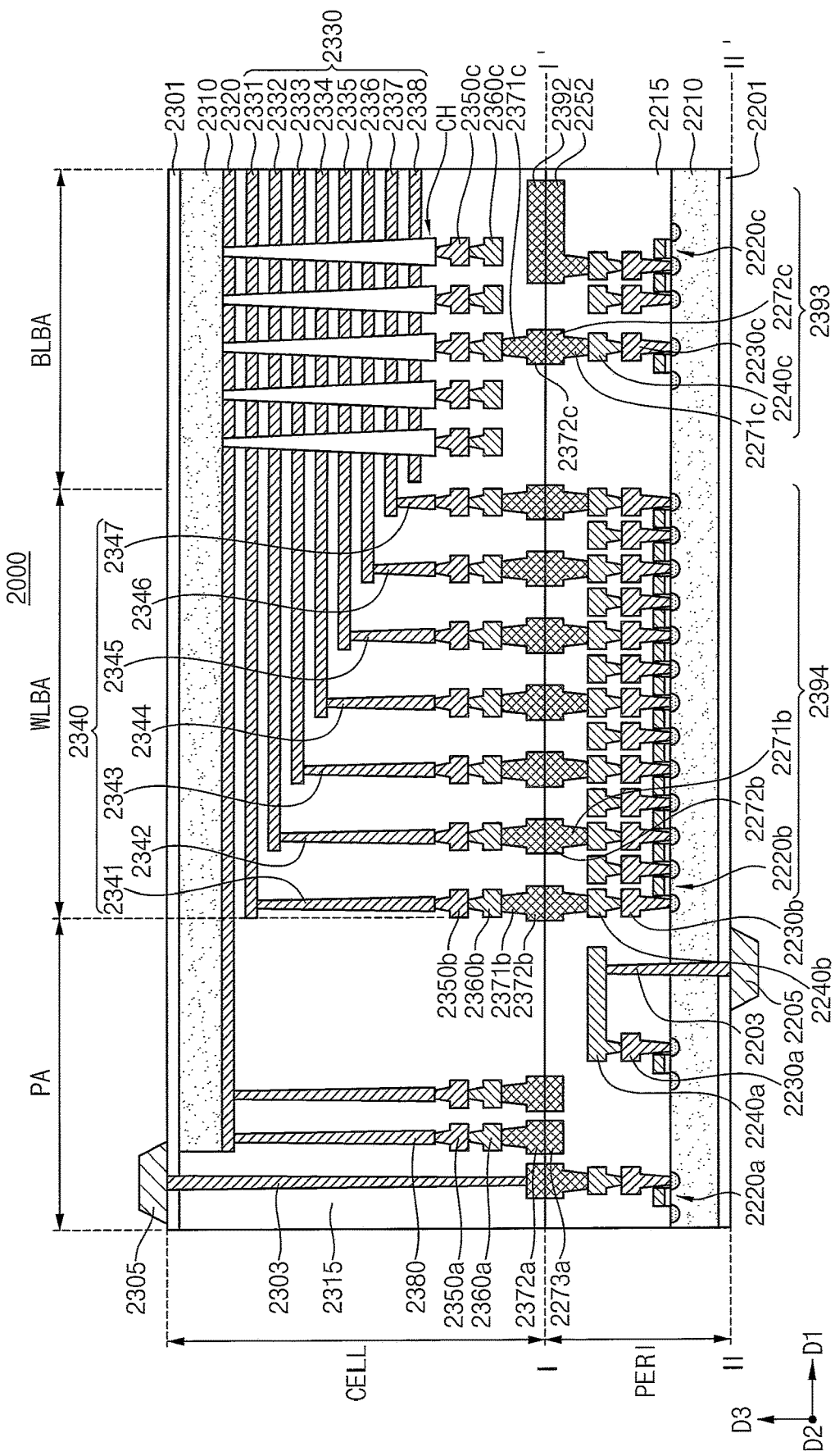
FIG. 19 is a cross-sectional view of a memory device according to example embodiments of the present disclosure.

FIG. 19 is a cross-sectional view of a memory device according to example embodiments of the present disclosure.

Referring to FIG. 19, a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PER1 on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The present disclosure, however, may not be limited thereto. For example, the bonding metals may also be formed of aluminum (Al) or tungsten (W).

Each of the peripheral circuit region PER1 and the cell region CELL of the memory device 2000 may include an external pad bonding area PA, a wordline bonding area WLBA, and a bitline bonding area BLBA.

The peripheral circuit region PER1 may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment of the present disclosure, the first metal layers 2230a, 2230b, and 2230c may be formed of tungsten having relatively high electrical resistivity, and the second metal layers 2240a, 2240b, and 2240c may be formed of copper having relatively low electrical resistivity.

In the embodiment illustrated in FIG. 19, although only the first metal layers 2230a, 2230b, and 2230c and the second metal layers 2240a, 2240b, and 2240c are shown and described, the present disclosure is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PER1 may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred to as first metal pads and the lower bonding metals 2271b and 2272b in the peripheral circuit region PER1 may be referred to as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337 and 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment of the present disclosure, the bitline 2360c may extend in a second direction D2 (e.g., a Y-axis direction), parallel to the upper surface of the second substrate 2310.

In the embodiment illustrated in FIG. 19, an area in which the channel structure CH, the bitline 2360c, and the like are disposed may be referred to as the bitline bonding area BLBA. In the bitline bonding area BLBA, the bitline 2360c may be electrically connected to the circuit elements 2220c providing a page buffer 2393 in the peripheral circuit region PER1. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346 and 2347 (e.g., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PER1 by the upper bonding metals 2371b and 2372b of the cell region CELL and the lower bonding metals 2271b and 2272b of the peripheral circuit region PER1 in the wordline bonding area WLBA.

The plurality of cell contact plugs 2340 may be electrically connected to the circuit elements 2220b forming a row decoder 2394 in the peripheral circuit region PER1. In an example embodiment of the present disclosure, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be referred to as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PER1 through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PER1 through a second input/output contact plug 2303. In the present embodiment, the second input/output pad 2305 is electrically connected to the circuit element 2220a.

According to example embodiments of the present disclosure, the second substrate 2310 and the common source line 2320 may not be disposed in an area in which the second input/output contact plug 2303 is disposed. In addition, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to example embodiments of the present disclosure, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERL.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL to be connected to each other, in an uppermost metal layer of the peripheral circuit region PER1 In the peripheral circuit region PER1, the lower metal pattern 2273a formed in the uppermost metal layer of the peripheral circuit region PERI may not be connected to a contact. Similarly, in the external pad bonding area PA, the upper metal pattern 2372a, corresponding to the lower metal pattern 2273a formed in an uppermost metal layer of the peripheral circuit region PER1, and having the same shape as the lower metal pattern 2273a of the peripheral circuit region PER1, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PER1 may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PER1, and having the same cross-sectional shape as the lower metal pattern 2252 of the peripheral circuit region PER1, may be formed in an uppermost metal layer of the cell region CELL. A contact may not be formed on the upper metal pattern 2392 formed in the uppermost metal layer of the cell region CELL.

In an example embodiment of the present disclosure, corresponding to a metal pattern formed in an uppermost metal layer in one of the cell region CELL and the peripheral circuit region PER1, a reinforcement metal pattern having the same cross-sectional shape as the metal pattern may be formed in an uppermost metal layer in the other one of the cell region CELL and the peripheral circuit region PER1. A contact may not be formed on the reinforcement metal pattern.

The present disclosure may be applied to various devices and systems that include memory devices. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments of the present disclosure and is not to be construed as limiting thereof. Although some example embodiments have been described, those skilled in the art will readily appreciate that many modifications are possible. Accordingly, all such modifications are intended to be included within the scope of the example embodiments as set forth in the claims.

What is claimed is:

1. A memory controller for a memory device, the memory controller comprising:
   a command generator configured to generate a command signal based on a system clock signal, and to generate phase difference information for the command signal; and
   a memory interface configured to receive the command signal and the phase difference information from the command generator, to adjust a timing of the command signal based on the phase difference information, and transmit the command signal of which the timing is adjusted as a timing adjusted command signal to the memory device,
   wherein the phase difference information represents a phase difference between the command signal generated based on the system clock signal and a standard command signal having a standard timing defined in a controller-memory interface standard.

2. The memory controller of claim 1, wherein, to adjust the timing of the command signal generated based on the system clock signal, the memory interface delays the command signal by a delay time corresponding to the phase difference represented by the phase difference information.

3. The memory controller of claim 1, wherein the command generator includes:
   a phase generation circuit configured to generate the phase difference information.

4. The memory controller of claim 1, wherein the memory interface includes:
   a phase control circuit configured to generate a delay control value based on the phase difference information; and
   a delay line configured to delay the command signal output from the command generator by a delay time corresponding to the phase difference represented by the phase difference information based on the delay control value.

5. The memory controller of claim 4, wherein the phase control circuit receives a clock lock value corresponding to a cycle time of the system clock signal, and calculates the delay control value based on the phase difference represented by the phase difference information, a resolution value of the phase difference and the clock lock value.

6. The memory controller of claim 5, wherein the phase control circuit calculates the delay control value by using an equation, "DCV=(PD/PRV)*CLV",
   where DCV represents the delay control value, PD represents the phase difference represented by the phase difference information, PRV represents the resolution value of the phase difference, and CLV represents the clock lock value.

7. The memory controller of claim 5, wherein the resolution value of the phase difference is settable.

8. The memory controller of claim 4, wherein the delay line includes:
   a coarse delay line configured to delay the command signal output from the command generator by a first interval in response to at least one most significant bit of the delay control value; and
   a fine delay line configured to delay the command signal output by the coarse delay line by a second interval narrower than the first interval in response to at least one least significant bit of the delay control value.

9. The memory controller of claim 4, wherein the memory interface further includes:
   a delay locked loop circuit configured to receive the system clock signal, and to generate a clock lock value corresponding to a cycle time of the system clock signal.

10. The memory controller of claim 9, wherein the delay locked loop circuit includes:
    a digital control delay line configured to generate an output clock signal by delaying the system clock signal;
    a phase detector configured to detect a phase difference between the system clock signal and the output clock signal; and
    a delay control circuit configured to control a delay time of the digital control delay line based on the phase difference detected by the phase detector, and to generate the clock lock value corresponding to the cycle time of the system clock signal.

11. The memory controller of claim 4, wherein the memory interface further includes:
    a flip-flop configured to capture the command signal output from the command generator in response to the system clock signal, and to output the captured command signal to the delay line.

12. The memory controller of claim 1, further comprising:
    a clock generator configured to generate the system clock signal, and to provide the system clock signal to the command generator and the memory interface.

13. A memory controller for a memory device, the memory controller comprising:
    a command generator configured to generate a command signal based on a system clock signal, and to generate phase difference information for the command signal; and
    a memory interface configured to receive the command signal and the phase difference information from the command generator, to adjust a timing of the command signal based on the phase difference information, and transmit the command signal of which the timing is adjusted as a timing adjusted command signal to the memory device,
    wherein the memory interface includes:
    a phase control circuit configured to generate a select signal based on the phase difference information;
    a plurality of flip-flops configured to capture the command signal output from the command generator in response to an input/output clock signal; and
    a multiplexer configured to select, as the timing adjusted command signal, one of output signals of the plurality of flip-flops in response to the select signal.

14. The memory controller of claim 13, wherein the plurality of flip-flops includes:
    a plurality of rising edge-triggered flip-flops connected in series, and configured to capture the command signal output from the command generator in response to a rising edge of the input/output clock signal; and
    a plurality of falling edge-triggered flip-flops connected in series, and configured to capture the command signal output from the command generator in response to a falling edge of the input/output clock signal.

15. A memory controller for a memory device, the memory controller comprising:

a clock generator configured to generate a system clock signal;

a command generator configured to generate a command signal in response to the system clock signal; and a memory interface configured to transmit a timing adjusted command signal to the memory device, wherein the command generator includes:
   a phase generation circuit configured to generate phase difference information representing a phase difference between the command signal and a standard command signal, and wherein the memory interface includes:
   a delay locked loop circuit configured to generate a clock lock value corresponding to a cycle time of the system clock signal;
   a phase control circuit configured to generate a delay control value based on the phase difference represented by the phase difference information, a resolution value of the phase difference and the clock lock value; and
   a phase application circuit configured to adjust a timing of the command signal by the phase difference represented by the phase difference information based on the delay control value and to output the command signal with the adjusted timing as the timing adjusted command signal.

16. The memory controller of claim 15, wherein the phase application circuit includes:
   a delay line configured to delay the command signal by a delay time corresponding to the phase difference represented by the phase difference information based on the delay control value.

\* \* \* \* \*